United States Patent
Kozakai et al.

(10) Patent No.: US 7,933,158 B2
(45) Date of Patent: Apr. 26, 2011

(54) NONVOLATILE MEMORY

(75) Inventors: Kenji Kozakai, Tachikawa (JP); Takeshi Nakamura, Kodaira (JP); Tatsuya Ishii, Koganei (JP); Motoyasu Tsunoda, Sagamihara (JP); Shinya Iguchi, Fujisawa (JP); Junichi Maruyama, Yokohama (JP)

(73) Assignee: Renesas Electronics Corporation, Kawsaki-shi (JP)

( * ) Notice: Subject to any disclaimer, the term of this patent is extended or adjusted under 35 U.S.C. 154(b) by 0 days.

(21) Appl. No.: 12/896,016

(22) Filed: Oct. 1, 2010

(65) Prior Publication Data

US 2011/0022913 A1  Jan. 27, 2011

Related U.S. Application Data

(63) Continuation of application No. 12/409,386, filed on Mar. 23, 2009, now Pat. No. 7,817,480, which is a continuation of application No. 12/048,208, filed on Mar. 13, 2008, now Pat. No. 7,525,852, which is a continuation of application No. 11/797,842, filed on May 8, 2007, now Pat. No. 7,366,034, which is a continuation of application No. 11/330,233, filed on Jan. 12, 2006, now Pat. No. 7,230,859, which is a continuation of application No. 11/053,423, filed on Feb. 9, 2005, now Pat. No. 7,012,845, which is a continuation of application No. 10/914,363, filed on Aug. 10, 2004, now Pat. No. 6,868,032, which is a continuation of application No. 10/667,505, filed on Sep. 23, 2003, now Pat. No. 6,788,575.

(30) Foreign Application Priority Data

Sep. 25, 2002 (JP) ................................. 2002-278952

(51) Int. Cl.
  *G11C 5/14* (2006.01)

(52) U.S. Cl. .................................. 365/189.09; 365/226
(58) Field of Classification Search ............ 365/189.09, 365/226
See application file for complete search history.

(56) References Cited

U.S. PATENT DOCUMENTS 5,469,390 A  11/1995  Sasaki et al.
(Continued)

FOREIGN PATENT DOCUMENTS

JP  07-200398 A  8/1995
(Continued)

*Primary Examiner* — Tuan T. Nguyen
(74) *Attorney, Agent, or Firm* — Miles & Stockbridge P.C.

(57) ABSTRACT

For a nonvolatile memory permitting electrical writing and erasing of information to be stored, such as a flash memory, the load on the system developer is to be reduced, and it is to be made possible to avoid, even if such important data for the system as management and address translation information are damaged, an abnormal state in which the system becomes unable to operate. The nonvolatile memory is provided with a replacing function to replace a group of memory cells including defective memory cells which are incapable of normal writing or erasion with a group of memory cells including no defective memory cell, a numbers of rewrites averaging function to grasp the number of data rewrites in each group of memory cells and to so perform replacement of memory cell groups that there may arise no substantial difference in the number of rewrites among a plurality of memory cell groups, and an error correcting function to detect and correct any error in data stored in the memory array, wherein first address translation information deriving from the replacing function and second address translation information deriving from the numbers of rewrites averaging function are stored in respectively prescribed areas in the memory array, and the first address translation information and second address translation information concerning the same memory cell group are stored in a plurality of sets in a time series.

4 Claims, 27 Drawing Sheets

U.S. PATENT DOCUMENTS

| | | |
|---|---|---|
| 5,754,567 A | 5/1998 | Norman |
| 5,765,184 A | 6/1998 | Durante |
| 5,784,327 A | 7/1998 | Hazani |
| 5,786,587 A | 7/1998 | Colgate, Jr. |
| 5,890,188 A | 3/1999 | Okamoto et al. |
| 6,058,048 A | 5/2000 | Kwon |
| 6,172,906 B1 | 1/2001 | Estakhri et al. |
| 6,209,113 B1 | 3/2001 | Roohparvar |
| 6,327,639 B1 | 12/2001 | Asnaashari |
| 6,373,748 B2 | 4/2002 | Ikehashi et al. |
| 6,397,314 B1 | 5/2002 | Estakhri et al. |
| 6,467,056 B1 | 10/2002 | Satou et al. |
| 6,496,411 B2 | 12/2002 | Yamada et al. |
| 6,563,755 B2 | 5/2003 | Yahata et al. |
| 6,611,938 B1 | 8/2003 | Tanaka et al. |
| 6,678,788 B1 | 1/2004 | O'Connell |
| 6,700,809 B1 | 3/2004 | Ng et al. |
| 6,711,054 B2 | 3/2004 | Kanamitsu et al. |
| 6,760,256 B2 | 7/2004 | Imamiya |
| 6,788,575 B2 | 9/2004 | Kozakai et al. |
| 6,876,559 B1 | 4/2005 | Rathnavelu et al. |
| 6,903,971 B2 | 6/2005 | Imamiya |
| 6,930,909 B2 * | 8/2005 | Moore et al. .................. 365/148 |
| 7,106,636 B2 | 9/2006 | Eilert et al. |
| 7,158,411 B2 | 1/2007 | Yeh et al. |
| 7,382,637 B1 | 6/2008 | Rathnavelu et al. |
| 7,660,184 B2 | 2/2010 | Kobayashi |
| 2008/0049505 A1 * | 2/2008 | Kim et al. ................ 365/185.11 |
| 2010/0091594 A1 | 4/2010 | Kobayashi |

FOREIGN PATENT DOCUMENTS

| | | |
|---|---|---|
| JP | 2000-251484 A | 9/2000 |
| JP | 2001-14888 A | 1/2001 |
| JP | 2001-109629 A | 4/2001 |

* cited by examiner

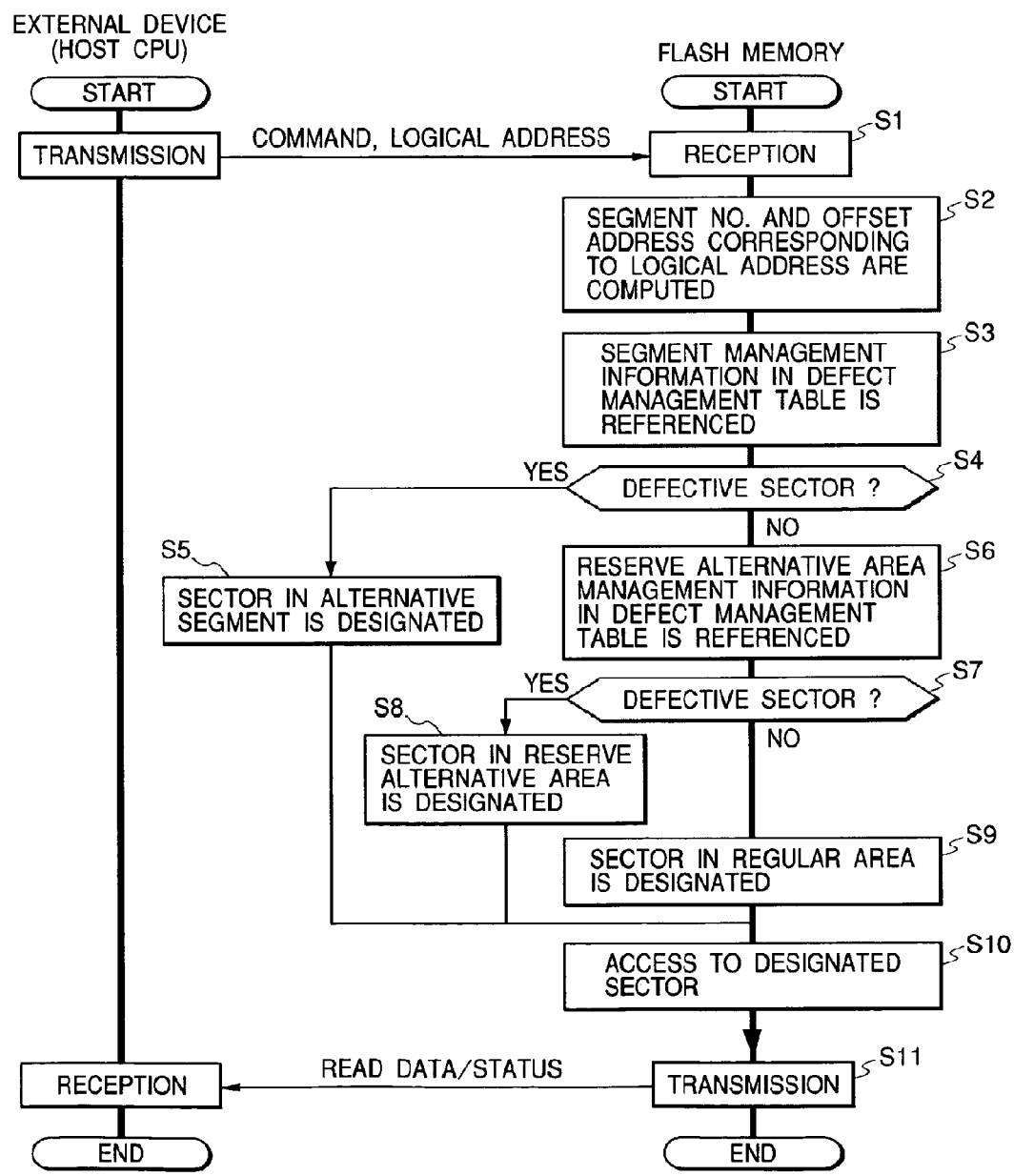

FIG. 6(A)

CONFIGURATION OF DATA AREA (2096 BYTES)

| 512 | 8 | 512 | 8 | 512 | 8 | 512 | 8 | 8 | 8 |
|---|---|---|---|---|---|---|---|---|---|
| PAGE 0 | *MANAGEMENT 0 | PAGE 1 | *MANAGEMENT 1 | PAGE 2 | *MANAGEMENT 2 | PAGE 3 | *MANAGEMENT 3 | ECC0 | ECC1 |

FIG. 6(B)

CONFIGURATION OF SECTOR MANAGEMENT AREA (16 BYTES)

| MGM CODE | ID CODE | MANAGEMENT HEADER | WL PROCESSING MANAGEMENT (WL ARRANGEMENT, COUNT OF ERASING) | CECC0 | CECC1 | HECC |
|---|---|---|---|---|---|---|

FIG. 6(C)

CONFIGURATION OF SECTOR MANAGEMENT AREA (SAND)

| MGM CODE | ID CODE | MANAGEMENT HEADER | WL PROCESSING MANAGEMENT (NO. OF SETTINGS) | CECC0 | CECC1 | HECC |
|---|---|---|---|---|---|---|

FIG. 7

| DEFECT MANAGEMENT TABLE | | | | | WL PROCESSING MANAGEMENT TABLE |
|---|---|---|---|---|---|
| AREA SETTING | SWAP MANAGEMENT | ALTANATIVE MANAGEMENT OFFSET | ALTANATIVE SEGMENT MANAGEMENT | RESERVE ALTANATIVE AREA MANAGEMENT | WL PROCESSING MANAGEMENT INFORMATION |

NONVOLATILE MEMORY

CROSS-REFERENCE TO RELATED APPLICATIONS

This application is a continuation of application Ser. No. 12/409,386 filed Mar. 23, 2009 now U.S. Pat. No. 7,817,480, which is a continuation of application Ser. No. 12/048,208 filed Mar. 13, 2008 (now U.S. Pat. No. 7,525,852 issued Apr. 28, 2009), which is a continuation of application Ser. No. 11/797,842 filed May 8, 2007 (now U.S. Pat. No. 7,366,034 issued Apr. 29, 2008), which is a continuation of application Ser. No. 11/330,233 filed Jan. 12, 2006 (now U.S. Pat. No. 7,230,859 issued Jun. 12, 2007), which is a continuation of application Ser. No. 11/053,423 filed Feb. 9, 2005 (now U.S. Pat. No. 7,012,845 issued Mar. 14, 2006), which is a continuation of application Ser. No. 10/914,363 filed Aug. 10, 2004 (now U.S. Pat. No. 6,868,032 issued Mar. 15, 2005), which is a continuation of application Ser. No. 10/667,505 filed Sep. 23, 2003 (now U.S. Pat. No. 6,788,575 issued Sep. 7, 2004).

BACKGROUND OF THE INVENTION

The present invention relates to a nonvolatile memory which permits electrical writing and erasion of information to be stored, and to a technique that can be effectively applied to a flash memory provided with a replacing function to any defective area in memory array and having an area in which to store a management information table for managing defective addresses.

A flash memory uses as its memory cells nonvolatile memory elements each consisting of a double gate-structured MOSFET having a control gate and a floating gate, and is caused to store information by varying the accumulated charge of the floating gate and thereby varying the threshold voltage of the MOSFET.

In a flash memory, the threshold voltage is varied when data are to be written into memory cells or data therein are to be erased, the currently available manufacturing techniques cannot avoid uneven variations of the threshold voltage due to uneven characteristics of memory cells even if writing or erasion is done under the same conditions, and sometimes there arise a defective memory cell or cells which do not allow sufficient threshold voltage variation.

A conventional flash memory is often provided with a replacing function to replace a prescribed memory area, when there arises any defective memory cell not allowing the threshold voltage to vary sufficiently, involving that defective memory cell with another normal memory area and another area in which to store management table information for managing defective addresses.

SUMMARY OF THE INVENTION

However, a conventional flash memory is usually designed to undergo rewriting of management table information for managing defective addresses and other Such functions by an external controller. Moreover, since the reliability of data in a flash memory is less than that of data in a mask ROM or RAM because of threshold voltage fluctuations in memory cells and their aging, in configuring a system using any flash memory the reliability of data is increased by equipping the external controller with an error checking and correcting function known as ECC. For this reason, a conventional flash memory imposes a greater load on the system developer when a new system using any flash memory is to be developed.

A conventional flash memory involves another problem that, where a storage area containing any defective memory cell is used as a system area for storing important data for the system, such as table data for managing file positions on the memory, format information and address translation information, it may become impossible to recognize the memory or for the system to operate normally.

An object of the present invention is to make it possible to reduce the load on the system developer by using a nonvolatile memory which permits electrical writing and erasion of information to be stored, such as a flash memory.

Another object of the invention is to make it possible, in a nonvolatile memory which permits electrical writing and erasion of information to be stored, such as a flash memory, to prevent the system using it from running into an abnormal state in which the system becomes unable, and enable the system to operate even if important data for the system, such as management and address translation information, are damaged.

The above-stated and other objects and novel features of the present invention will become more apparent from the following detailed description when taken in conjunction with the accompanying drawings.

Typical aspects of the invention disclosed in this application will be briefly described below.

Thus, according to a first aspect of the invention, a nonvolatile memory permitting electrical writing and erasing of information to be stored, such as a flash memory, is provided with a replacing function to replace a group of memory cells including defective memory cells which are incapable of normal writing or erasion with a group of memory cells including no defective memory cell; a numbers of rewrites averaging function to grasp the number of data rewrites in each group of memory cells and to so perform replacement of memory cell groups that there may arise no substantial difference in the number of rewrites among a plurality of memory cell groups; and an error correcting function to detect and correct any error in data stored in the memory array, wherein first address translation information deriving from the replacing function and second address translation information deriving from the numbers of rewrites averaging function are stored in respectively prescribed areas in the memory array, and the first address translation information and second address translation information concerning the same memory cell group are stored in a plurality of sets in a time series.

As the nonvolatile memory described above has a replacing function and an error correcting function, there is no need to cause an external controller to process replacement or error correction, it is made possible to reduce the load on the system developer and, since a plurality of sets of address translation information are stored, it is further made possible to avoid, even if any set of address translation information is lost, an abnormal state in which the system becomes unable to operate by having another set of such information substituted for the lost information.

Preferably, the memory array should be provided with two or more areas which do not affect each other even if power supply is interrupted during the process of writing into or erasing data in any of the memory cell groups, and the plural sets of first address translation information and second address translation information be stored successively in the two or more second areas. This makes it possible to prevent, even if data in any area in which address translation information is to be stored are lost as a result of writing or erasion, such information stored in other areas from being lost, and to avoid without fail an abnormal state in which the system becomes unable to operate.

BRIEF DESCRIPTION OF THE DRAWINGS

FIG. 5 is a flow chart of the sequence of processing by the managing section of the flash memory of this embodiment.

FIGS. 6(A) to 6(C) show an example of configuration of each sector in regular areas and alternative areas of the flash memory of this embodiment, in which FIG. 6(A) shows the configuration of a data area and FIG. 6(B) shows the configuration of a sector management area where the flash memory is set to an AND or a NAND specification, and FIG. 6(C) shows the configuration of a sector management area where the flash memory is set to a SAND specification.

FIG. 7 illustrates a schematic configuration of the management table in the flash memory of this embodiment.

DETAILED DESCRIPTION OF THE PREFERRED EMBODIMENTS

One preferred embodiment of the present invention will be described in detail below with reference to the accompanying drawings.

Figure 1:
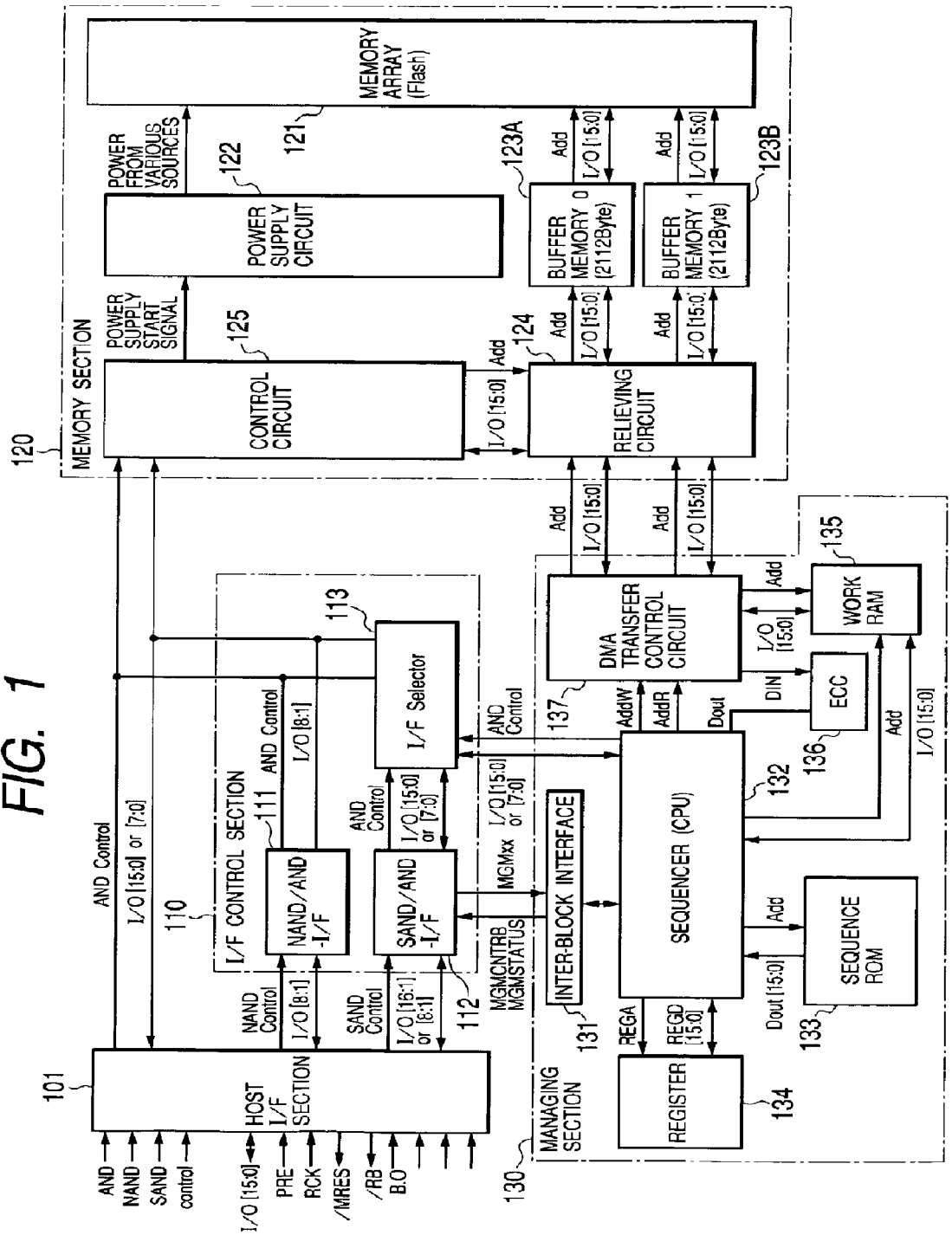
FIG. 1 is a block diagram illustrating an embodiment of flash memory as an example of nonvolatile memory to which the present invention can be effectively applied.

FIG. 1 is a block diagram illustrating an embodiment of flash memory as an example of nonvolatile memory to which the present invention can be effectively applied. The flash memory of this embodiment is composed of a host interface section 101 to perform inputting and outputting of signals to and from a controller, such as an external host CPU, an interface control section 110 to control the host interface section 101, a memory section 120 consisting of a flash memory array 121 in which a plurality of nonvolatile memory elements (memory cells) are arranged in a matrix and its peripheral circuits, and a managing section 130 to manage defective addresses and the like. These elements are formed over a single semiconductor chip, such as a monocrystalline silicon chip.

Whereas conventional flash memories include a plurality of kinds of chips differing in the specification of external terminals, and the flash memory of this embodiment is so configured as to be able to apparently operate as a chip of a specification known as the NAND type, one of a specification known as the AND type or one of a specification known as the Super AND (SAND) type out of the plurality of conventional types, and as which of these types it is to operate is determined by the bonding option, i.e. the set state of a prescribed bonding pad B.O. connected to the interface control section 110. A difference in specification means differences in the types and arrangement of external terminals.

In this embodiment of the invention, the flash memory array 121 of the memory section 120 consists of the AND type in which a plurality of memory cells are connected in parallel between bit lines and source lines, though it is not limited to this configuration. When the interface control section 110 is set to "AND" in terms of the aforementioned bonding option, any command from outside entered into the interface control section 110 is supplied as it is to the memory section 120.

The interface control section 110 is configured of interfaces for converting commands according to the setting by the bonding option including a NAND/AND interface 111 which, if the interface control section 110 is set to "NAND", converts commands of the NAND specification into commands of the AND specification and supply them to the memory section, a SAND/AND interface 112 which, if the interface control section 110 is set to "SAND", analyzes commands of the SAND specification and generates control signals for the memory section 120 and the managing section 130, and an interface selector circuit 113 for selecting signals for supply to the memory section 120 between signals coming via either of these interfaces 111 and 112 and signals from the managing section 130.

The memory section 120 is configured of the flash memory array 121 including nonvolatile memory elements, a power supply circuit 122 for generating voltages needed for writing data into and erasing data in the memory array 121, two buffer memories 123A and 123B for temporarily storing write addresses and write data to be supplied to the flash memory array 121 and read addresses read out of the flash memory array 121, a relieving circuit 124 for translating the address when an area containing any defective memory cell is replaced in a prescribed unit (e.g. a segment consisting of 128 sectors) with a normal area, and an AND control circuit 125 for generating an actuation signal for the power supply circuit 122, supplying an address entered via the host interface section 101 to the relieving circuit 124 and converting read data and write data.

The flash memory array 121 includes a decoder for decoding addresses and selecting word lines and a sense amplifier for amplifying signals on bit lines in addition to the memory array. Each of the memory cells constituting the memory array 121 consists of a MOSFET having a floating gate and a control gate, and is caused to store information by a variation in the threshold voltage according to the quantity of electric charges injected to the floating gate. The buffer memories 123A and 123B consist of, though not limited to, SRAMs. Whether to cause the relieving circuit 124 to perform segment-by-segment replacement is determined according to the result of water test.

The managing section 130 is configured of an inter-circuit block interface 131 for enabling signals to be exchanged between the interface control section 110 and the managing section 130, a sequencer 132 consisting of a programmed control type controller, such as a CPU, for controlling operations within the chip, a sequencing ROM 133 for storing the operations of the sequencer in a form like a microprogram consisting of control codes, a register 134 for use by the sequencer, a work RAM 135 for developing an address translation table or providing a work area for the sequencer 132, an ECC circuit 136 for checking and correcting errors, and a DMA transfer control circuit 137 for controlling data transfers between the memory section 120 and the work RAM 135 or the ECC circuit 136.

In the flash memory of this embodiment, the memory array 121 is so configured that the unit writing is a group of memory cells consisting of 2112 bytes (hereinafter referred to as a sector) connected to a single word line. Further in the memory array 121, the management of areas is differentiated between a regular area and a reserve area for replacing a sector containing any defective memory cell in the regular area. A defective address management table to establish correspondence of sectors in the regular area to sectors in the reserve area is generated by the managing section 130 and stored into the flash memory array 121. During normal operation, the defective address management table is developed in the work RAM 135 and referenced. When an address entered from outside designates a sector containing a defective memory cell, this defective address management table is referenced to translate the entered address into an address designating an alternative sector in the reserve area, and the flash memory array 121 is accessed according to this translated address. The defective sector is thereby replaced.

Figure 2:
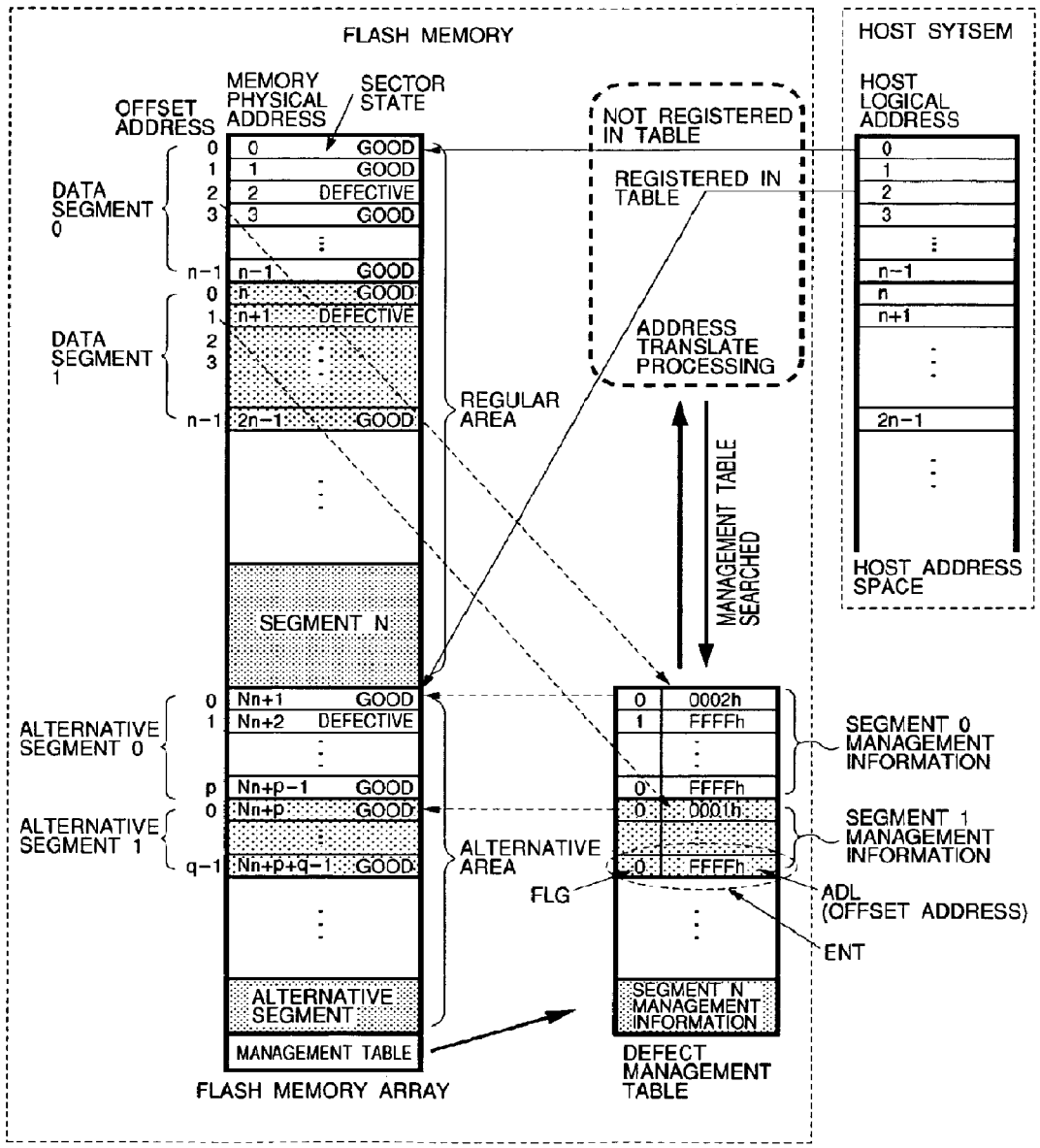
FIG. 2 illustrates the concept of replacement according to a first formula in the flash memory of this embodiment.

Further in the flash memory of this embodiment, two different formulas of replacement processing are available. FIG. 2 illustrates the concept of replacement according to a first formula. In this first formula of replacement processing, the flash memory array 121 is divided into a regular area and a reserve area for replacing a sector containing any defective memory cell in the regular area. Each sector is further divided into a data area for storing data as such (user data) and a sector management information area for storing an MGM code indicating whether or not a given sector contains any defective memory cell, an error correction code and so forth. The regular area consists of N segments (N=64, for instance) each consisting of n sectors (n=128, for instance). The reserve area is also composed of N segments (of which the number of sectors is variable) corresponding to the N segments of the regular area, and the segments in the regular area are in one-to-one correspondence with those in the reserve area.

Sector management information in the management table is composed of an entry ENT consisting of an information column ADL indicating the position of any defective sector in the replacing source and a flag FLG indicating whether or not the alternative sector is a good sector or a defective sector. For instance if an alternative sector Nn+2 in FIG. 2 is defective, "1" is set on the flag of the corresponding entry. In each entry of the management table, information indicating the position of a defective sector is registered as a value of offset OFS from the leading address of the segment. Entries of the sector management information in the management table are in one-to-one correspondence with sectors in the reserve area.

The managing section 130, if for instance the sector of the physical address "2" in FIG. 2 is found to be a defective sector as a result of write operation, stores data into an alternative sector (e.g. Nn+1) of segment 0 in the alternative area corresponding to segment 0 in the regular area to which the pertinent sector belongs. Upon successful storing of the data, the offset value "0002h" of the sector of the replacing source is stored into the entry, corresponding to this sector, in the management table and, at the same time, the flag is set to "0". Further, the managing section 130, when accessing a sector in segment 0 of the regular area, computes the offset value from the address of the pertinent sector, judges whether or not it is a defective sector by successively referencing entries in segment 0 of the management table and, if it is registered as a defective sector, accesses a sector, corresponding to that entry in the reserve area. Address translation takes place on this occasion.

This replacement formula permits a reduction in the data quantity of the table, i.e. the storage capacity of the work RAM 135, because it divides the regular area into segments for the management purpose and therefore offset values can be used, instead of physical addresses, as sector position information to be registered in the defective address management table. The length of time taken to search the management table can be shortened accordingly.

Figure 3:
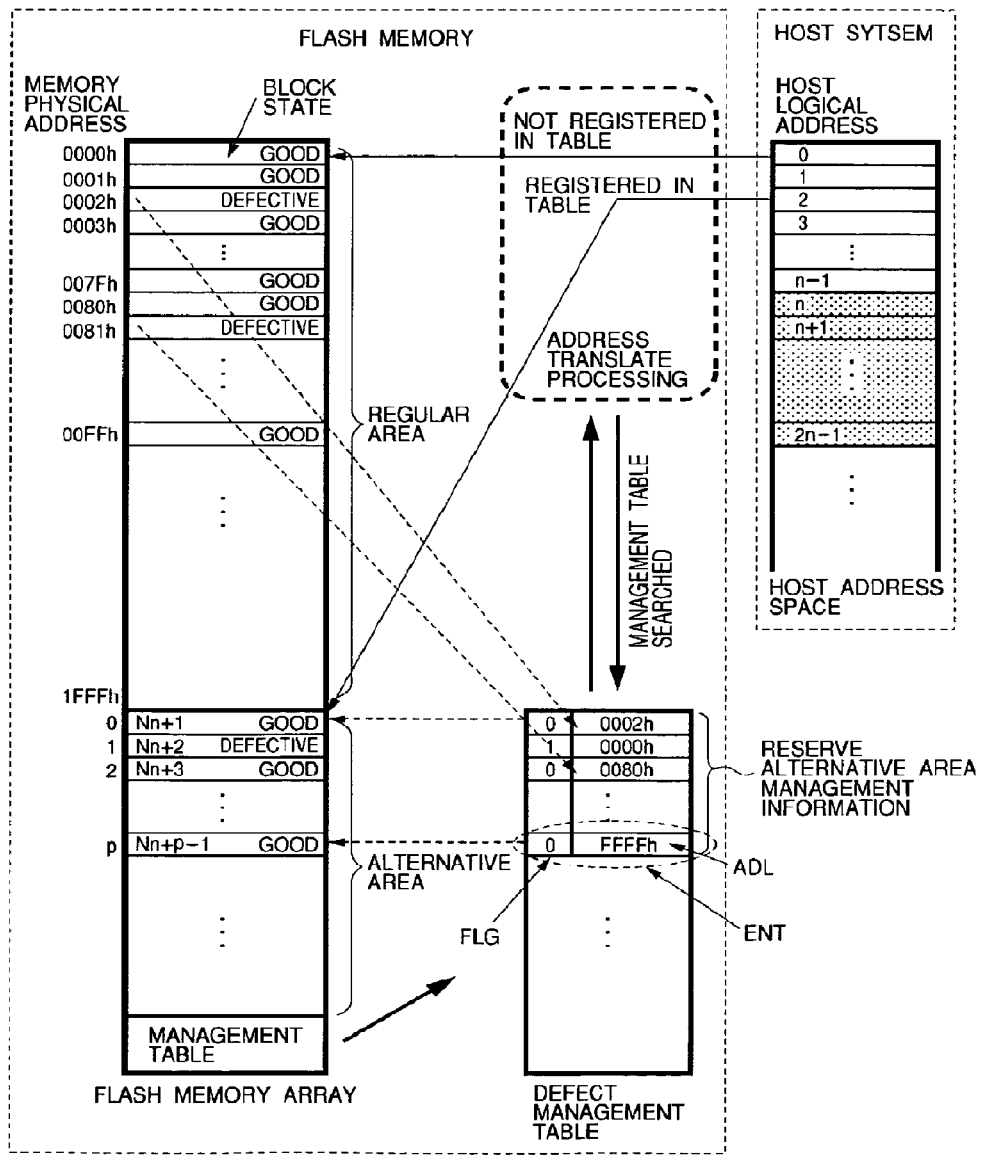
FIG. 3 illustrates the concept of replacement according to a second formula in the flash memory of this embodiment.

FIG. 3 illustrates the concept of replacement according to a second formula. While the processing of replacement according to the first formula divides both the regular area and the alternative area of the flash memory array into segments, that according to this second formula involves no division into segments, but a defective sector having arisen anywhere in the regular area is replaced by some sector in the alternative area. This formula, though it necessitates a greater data quantity of the table, i.e. a greater storage capacity of the work RAM 135, and accordingly a greater length of time taken to search the management table because physical addresses are used as defective sector position information to be registered in the management table, it has its own advantages that the alternative area can be utilized more efficiently, computation of offset values and the like can be dispensed with and the processing of replacement is simplified. More specifically, while the first formula requires a change in the segment size in the reserve area if defective sectors subsequently arise concentratively in a given segment, the second formula needs no such change.

Figure 4:
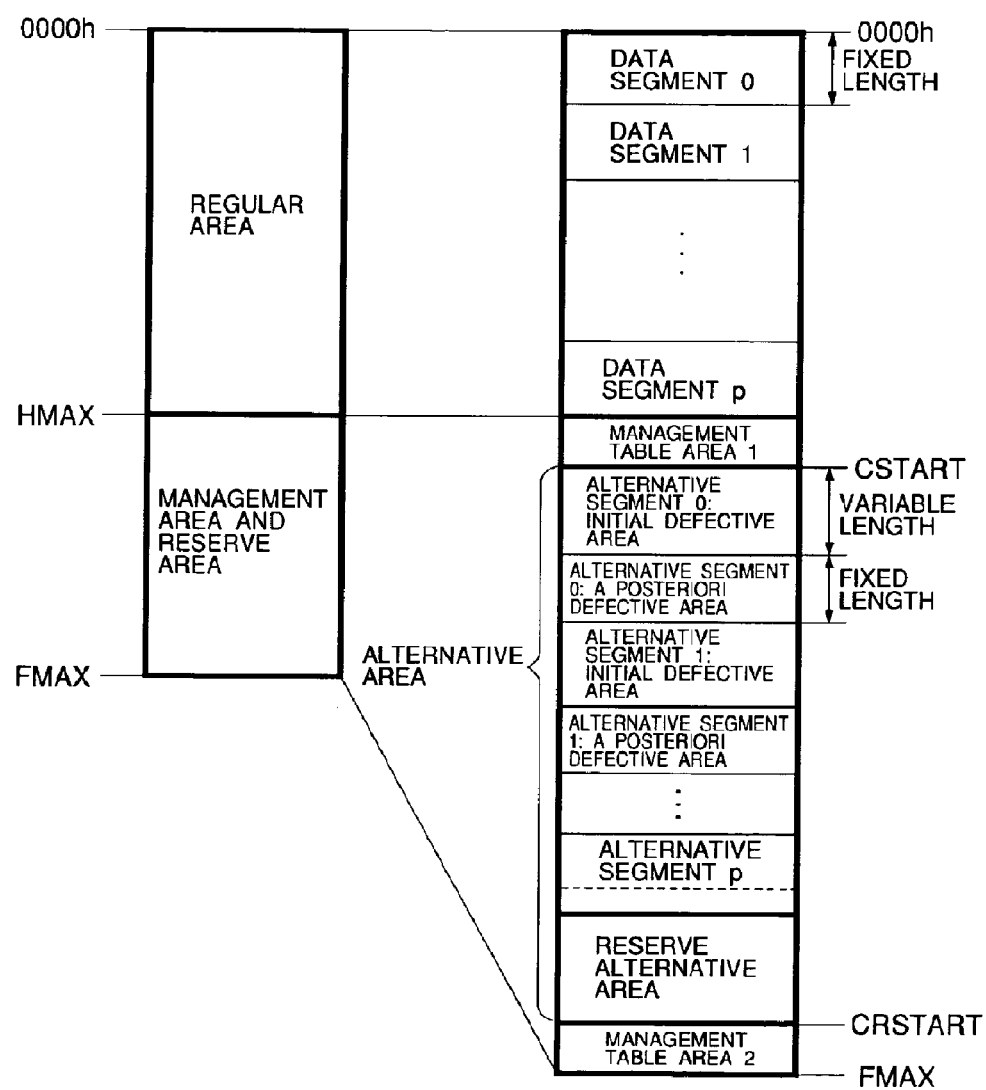
FIG. 4 illustrates the overall configuration of the flash memory of this embodiment.

To add, instead of selectively applying either the first formula or the second formula of replacement processing, it is also conceivable to apply the first formula to replacement of any defective sector detected in the testing stage and to apply the second to the replacement of any defective sector that has emerged in a state of regular use after the shipment of the product. Further, as shown in FIG. 4, it is also conceivable to provide in the alternative area an alternative segment area of which the maximum number of alternative sectors is variable, an alternative segment area of which the maximum number of alternative sectors is fixed, and a reserve alternative area, to apply the first formula using the alternative segment area of which the maximum number of alternative sectors is variable to the replacement of any defective sector detected in the testing stage, the first formula using the alternative segment area of which the maximum number of alternative sectors is fixed to the replacement of any defective sector that has emerged in a state of regular use after the shipment of the product, and the second formula of using the reserve alternative area to the replacement of any defective sector that has emerged in a segment for which all the sectors of the alternative segment have been used up.

FIG. 5 shows the sequence of processing by the managing section in a system using a flash memory in which the first formula applying the alternative segment area of which the maximum number of alternative sectors is fixed until midway in the processing to the replacement of any defective sector arising in a state of regular use and the second formula of using the reserve alternative area to the replacement of any defective sector that has emerged in a segment for which all the sectors of the alternative segment have been used up. When an external control device such as a host CPU (hereinafter referred to as an external device) transmits a command and an address to the flash memory, the flash memory receives them and first computes the corresponding segment and offset on the basis of the received logical address (steps S1 and S2).

Next, by referencing segment management information in the defect management table, it is determined whether or not the sector to be accessed is a defective sector (steps S3 and S4). If it is determined to be a defective sector, address translation is performed to designation an alternative sector, corresponding to the pertinent entry in the alternative segment (step S5). On the other hand, if no defective sector is detected in the determination at step S4, the reserve alternative area management information in the defect management table is referenced to determine whether or not the sector to be accessed is a defective sector (steps S6 and S7). If it is determined to be a defective sector, address translation is performed to designate a corresponding alternative sector in the reserve alternative area (step S8).

On the other hand, if no defective sector is detected in the determination at step S4 and step S7, a corresponding sector in the regular area is designated directly (step S9). After that, the designated sector is accessed, and data are either read or written (step S10). Then, if the received command is a read command, the written data are or, if it is a write command, a signal indicating the end of writing or a status is transmitted to the external device to end the processing (step S11).

FIGS. 6(A) to 6(C) show an example of configuration of each sector in regular areas and alternative areas. The sectors are divided into, for instance, a 2096-byte data area and a 16-byte sector management area, of which the configuration of the data area is shown in FIG. 6(A), and that of the sector management area where the flash memory is set to the AND or the NAND specification is shown in FIG. 6(B). FIG. 6(C) shows the configuration of the sector management area where the flash memory is set to the SAND specification.

The data area of each sector, as shown in FIG. 6(A), is composed of four 512-byte page areas Page 0 through Page 3, 8-byte management areas for storing management information, each corresponding to one or another of the page areas, and areas for storing 16-byte error correcting codes ECC0 and ECC1. In the flash memory of this embodiment, a data area change command is available, and when only a read command is entered, data in the 512-byte page areas Page 0 through Page 3 are read to outside the chip. If a read command is entered after a data area change command is entered, data of 520 bytes including the 512-byte page areas Page 0 through Page 3 and the following data of 8 bytes each are read to outside the chip. Instead of changing the data unit by using a command, it is conceivable to make available a plurality of commands or to adopt a configuration in which the read data unit is changed according to a mode set by a bonding option. It is also conceivable to use the management area following each page area for storing the ECC code of data in the corresponding page area.

Each sector management area, as shown in FIG. 6(B), consists of an area for storing an MGM code indicating whether or not the pertinent sector is a good sector, an area for storing an identification code of the sector, an area for storing a management header for managing the hysteresis of the management area, an area for storing management information on the averaging of the numbers of rewrites (arrangement and the counts of erasing) (WL processing), and an area for storing error correction codes CECC0, CECC1 and HECC. A sector management area set to the SAND specification as shown in FIG. 6(C), has a smaller area for storing management information on the averaging of the numbers of rewrites than in the case of NAND or AND and a larger area for storing a management header.

Figures 8A, 8B, 8C, 8D:
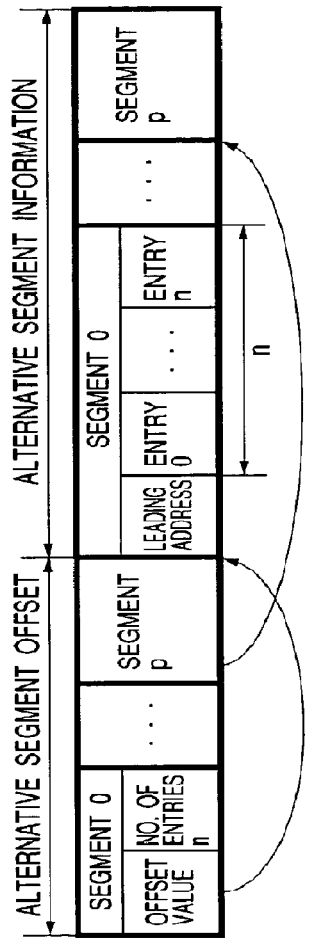
FIGS. 8(A) to 8(D) illustrate a detailed configuration of each of the areas constituting the management table in the flash memory of this embodiment.

FIG. 7 and FIGS. 8(A) to 8(D) illustrate the configuration of individual sectors in the management table area. FIG. 7 illustrates the overall configuration of a sector, and each of FIGS. 8(A) through 8(D), a detailed configuration of each of the areas shown in the areas shown in FIG. 7. Each sector in the management table area, as shown in FIG. 7, is divided into an area setting area for storing information indicating the area of the management table, a swap management area for storing information on substitution on a segment-by-segment basis, an area for storing management information on alternative segments, an area for storing management information on reserve alternative areas, and an area for storing management information on the averaging of the numbers of rewrites. Though not shown in FIG. 7, an area for storing error correction codes is also provided at the end. FIG. 8(A) shows the configuration of the swap management area, FIG. 8(B), that of alternative segment management areas, FIG. 8(C), that of the alternative area management area, and FIG. 8(D), that of the area for the management area of the averaging of the numbers of rewrites.

Next will be described the averaging of the numbers of rewrites.

The averaging of the numbers of rewrites in a conventional flash memory is to search, when the number of rewrites in a given sector has reached a certain level, for a sector whose number of rewrites is the smallest and to replace the address. Unlike that, the averaging of the numbers of rewrites in the flash memory of this embodiment, as shown in FIG. 9, is block-by-block processing, in which each of the blocks which constitute the flash memory array consists of 1024 sectors, and when the number of rewrites in a given sector has reached a certain level, addresses are successively rotated by one block at a time so as to store the data in that sector into a sector in the same offset position in an adjoining block.

Figures 9A, 9B, 9C:
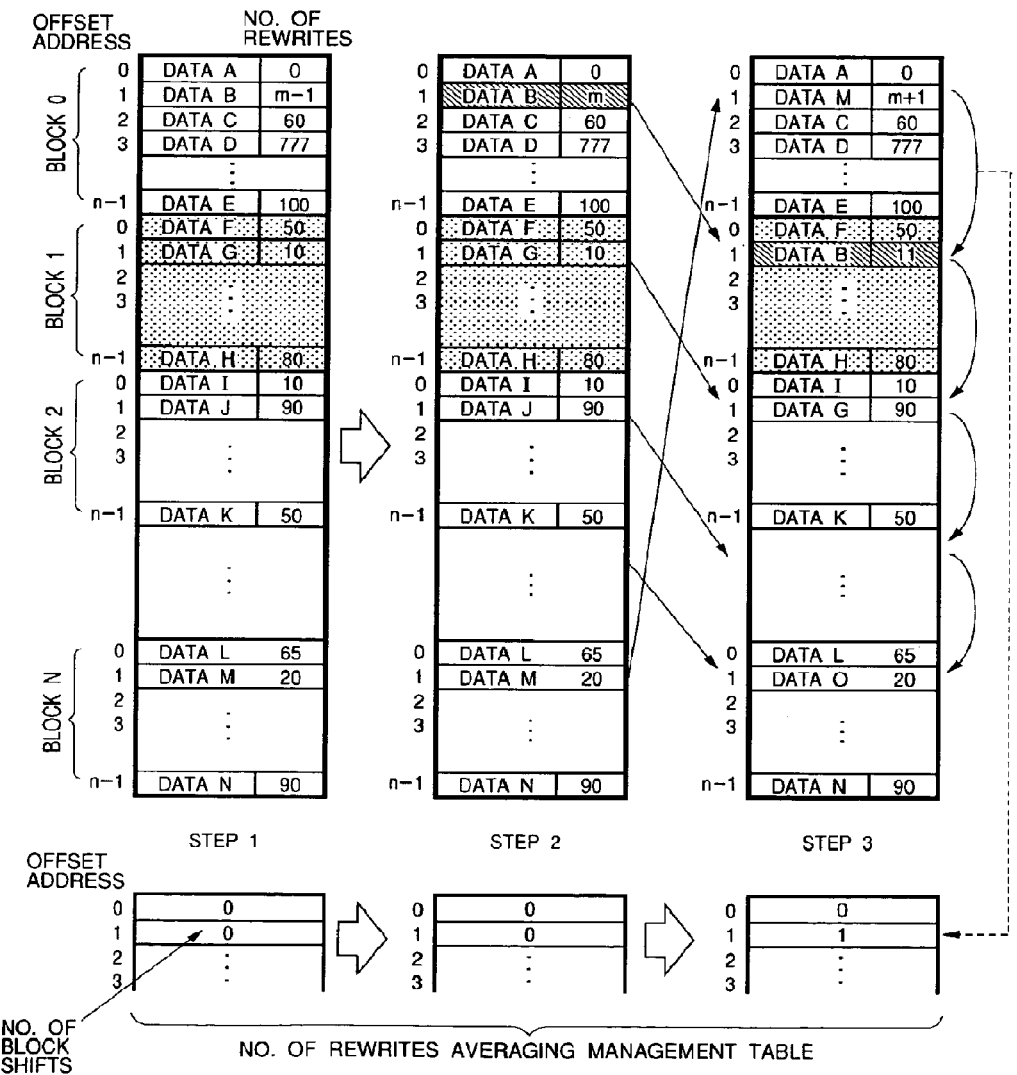
FIGS. 9(A) to 9(C) illustrate the concept of averaging the number of rewrites in the flash memory of this embodiment.

More specifically, referring to FIG. 9, when the number of rewrites in the sector of offset address 1 in block 0 has reached a prescribed number m (m=1000 for instance) as seen in (A)→(B), data B in the sector of offset address 1 in block 0 are shifted to and written into the sector of offset address 1 in block 1 as shown in (C), data G in the sector of offset address 1 in block 1 are shifted to and written into the sector of offset address 1 in block 2, data J in the sector of offset address 1 in block 2 are shifted to and written into the sector of offset address 1 in block 3, and so forth. Thus by successive shifting from one block to next, data and the number of rewrites are stored. Further, interlocked with the shifting of the data writing area, the number of shifts per offset is written into and stored in the numbers of rewrites averaging management area.

The conventional way of averaging the numbers of rewrites, by which, when the number of rewrites in a given sector has reached a certain level, a sector whose number of rewrites is the smallest is searched for and address replacement is performed has the disadvantage that a considerable length of time is taken to find a sector whose number of rewrites is the smallest and that the size of the address translation table becomes great. By contrast, the shift-type method of averaging the numbers of rewrites used in this embodiment of the invention has the advantages that the processing to determine the sector to which data are to be shifted and the address of the destination of the shift can be obtained by computation, thereby making the address translation table unnecessary. As the numbers of rewrites averaging management area has only to store the number of shifts, consisting of no more than a few bits, the required storage area can be far smaller than where addresses are to be stored.

Next will be described the work RAM 135.

Figure 10:
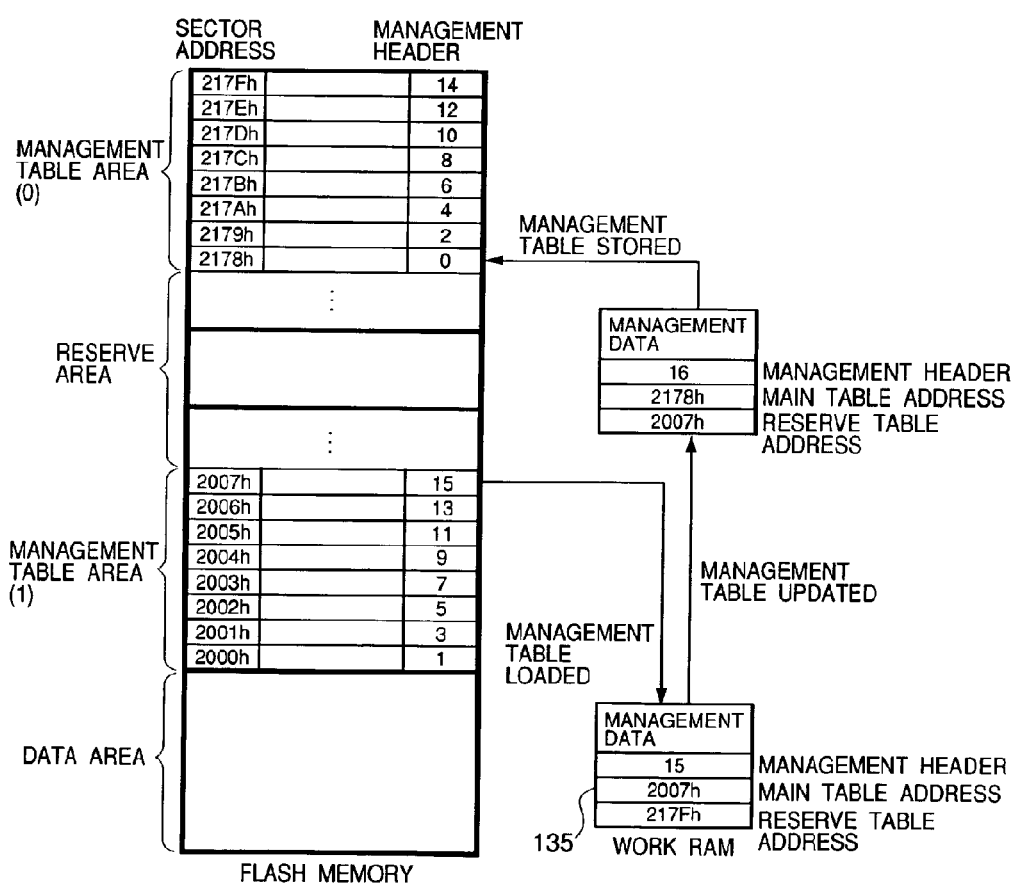
FIG. 10 illustrates the manner of hysteresis management of the management table in the flash memory of this embodiment.

In the flash memory of this embodiment, when power supply is turned on, table data stored in the management table areas of the memory array 121 are read out into and developed in the work RAM 135. Its configuration is such that, while the power supply is on, the data in the memory array 121 are not rewritten even if the table data are updated, and when the power supply is turned off, data in the work RAM 135 are stored into the management table areas of the memory array 121. Moreover, this embodiment has a configuration in which, as shown in FIG. 10, two management table areas available in the memory array are alternately used to store table data and each of the management table areas is further divided into a plurality of (e.g. eight) areas to store the data sequentially. It is also conceivable to rewrite, if table data are updated when the power supply is on, data in the management table on the work RAM and to rewrite table data in the corresponding management table in the memory array 121.

As stated above, by reading out into and developing on the work RAM 135 table data stored in the management table areas of the flash memory array 121, the determination of whether or not the access address is the address of a defective sector and the acquisition of the address of an alternative sector can be accomplished in a short period of time. Furthermore, the configuration in which table data are stored alternately into one or the other of two management table areas makes possible, even if all the data in one of the management table areas are lost by a power interruption during rewriting, data in the management table of one generation before can be reproduced. In addition, the configuration in which each management table area is divided into a plurality of areas into which data are sequentially stored results in realization of averaging of the numbers of rewrites within the management table area, thereby making it possible to prevent the reliability of data from being deteriorated by the surpassing of a bearable limit of the number of rewrites.

Incidentally in this embodiment, since the quantity of table data is not too large to be accommodated in the data area of one sector having a storage capacity of 2096 bytes, each management table storage area is made corresponding to one sector, and each of the management table areas 0 and 1 is provided corresponding to one block. Further in FIG. 10, the management headers represent the positions of management tables stored indifferent areas in temporal order. Thus, the management table stored in the area bearing the biggest management header number is the latest table, and the management table stored in the area bearing the smallest management header is the earliest table. Therefore, if the sequencer 132 references all the management headers in the management table areas within the flash memory array 121 and reads out the table data having the largest value among them, the latest management table can be obtained.

FIG. 10 shows how a management table stored in the area bearing the management header "15" in the management table area (1) is read into the work RAM 135, updated according to writing into the flash memory array, and stored into the area bearing the management header "0" in the management table area (0). In the management header of the management table immediately after reading out to the work RAM is stated "15", a sector address "2007h" is stated in the main address column, and a sector address "217Fh" (management header="14") stored in the management table one before is stated in the reserve table address column.

Then, this management table loaded on the RAM is updated, and the management header of the management table is changed from "15" to "16". In the main table address column is stated the sector address "2178h" of the area whose management header number is the smallest (the management header="0" in FIG. 10) in the management table area (0) in which the pertinent table is to be stored next, and in the reserve table address column is stated the sector address "2007h" (the management header="15") at which the table was stored when it was read out. When power supply is interrupted, management table data on the RAM are stored in accordance with the updated sector address of the main table address column.

The term "reserve table" is used here because, according to the management table storage formula of this embodiment of the invention, if the current or the latest management table data are lost or damaged for any reason, the management table one before can be read out and used If data in that management table one before is found abnormal, data in the management table another before can be used. This enables important data for the system to be restored, and makes it possible to minimize the risk of such abnormality that the memory can no longer be recognized or the system cannot be actuated.

Figure 11:
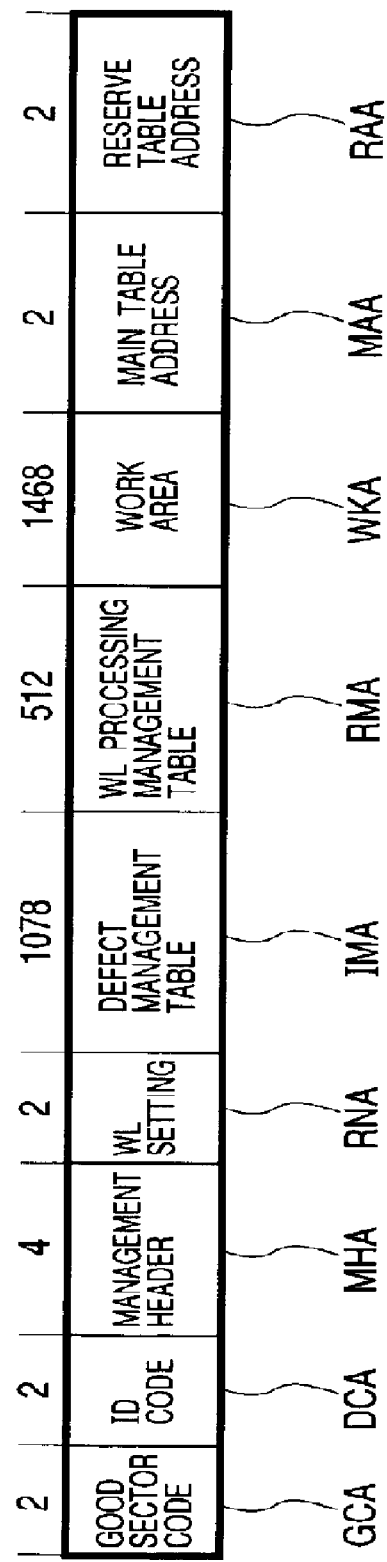
FIG. 11 illustrates an example of work RAM configuration in the flash memory of this embodiment.

FIG. 11 illustrates a typical configuration of the work RAM 135. As shown in FIG. 11, the work RAM 135 consists of a good sector code storage area GCA, an identification code storage area DCA, a management header storage area MHA, a setting storage area RNA for averaging the numbers of rewrites, a defect management table storage area IMA, a storage area RMA for the numbers of rewrites averaging management tables, a sequencer work area WKA, a main table address storage area MAA in which the management tables for use at the time of reading are stored, and a reserve table storage area RAA indicating the address at which the management table at the time of previous reading was stored.

Data in other areas than the work area WKA are read out of the flash memory array 121 at the time power supply is turned on, and developed in the various areas constituting the work RAM 135. Updating of the defect management table ensuing from replacement processing when a defective sector is detected anew during operation and updating of the management table in connection with the averaging of the numbers of rewrites when a sector in which the number of rewrites has reached a prescribed level are carried out on the work RAM 135. Updating of the main table address and the reserve table address takes place when data in the work RAM 135 are stored into the flash memory array 121.

Figure 12:
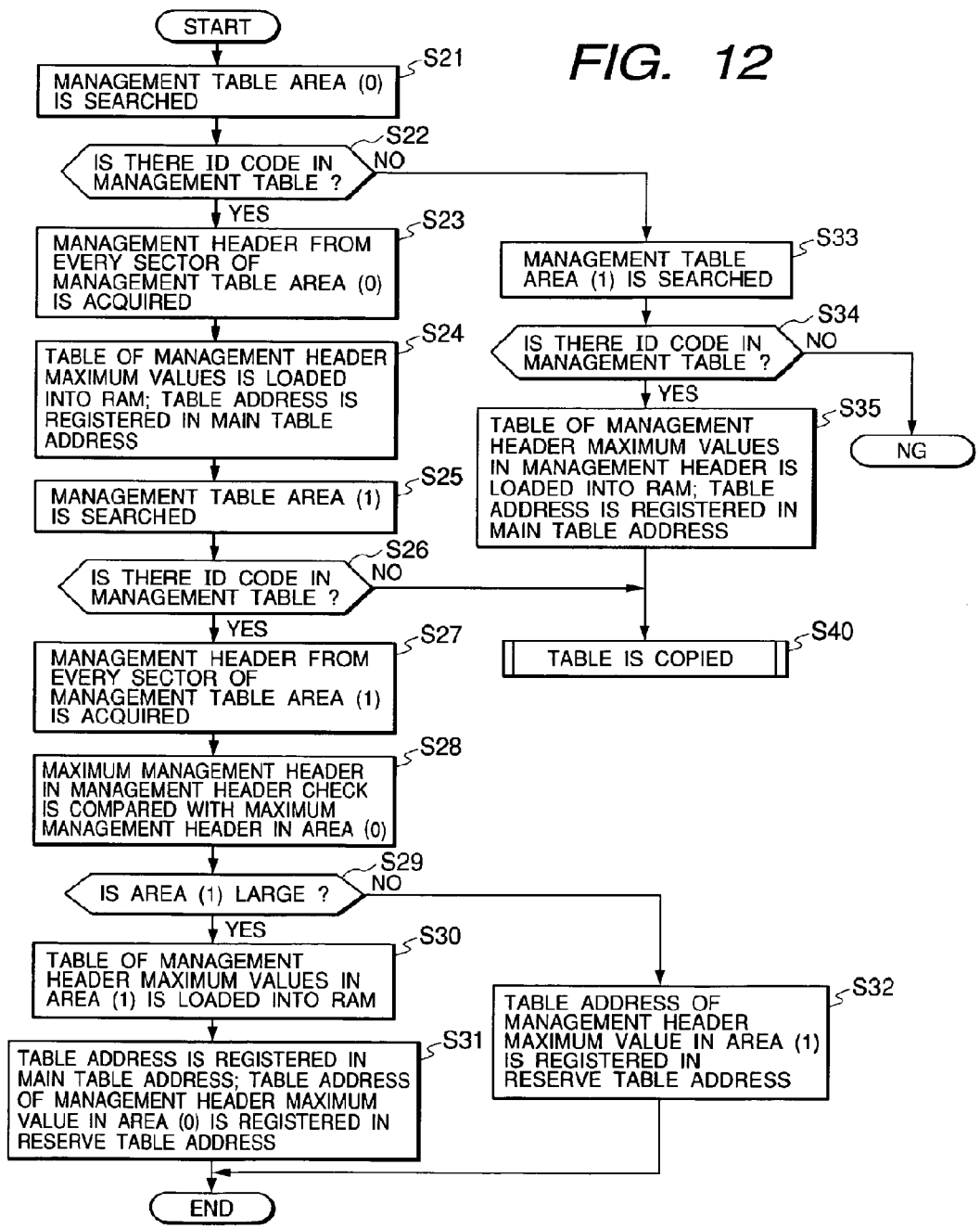
FIG. 12 is a flow chart showing the sequence of processing in the flash memory of this embodiment to read data in the management table area out of the flash memory array into the work RAM.

FIG. 12 shows the sequence of processing to read data in the management table area out of the flash memory array 121 into the work RAM 135.

The sequencer 132 first searches the management table area (0) of the flash memory array (step S21). Then it checks the identification code to judge whether or not there are effective management table data (step S22). If no effective management table data are found in the management table area (0) here, the process goes ahead to step S33 to search the management table area (1) and check the identification code to judge whether or not there are effective management table data (step S34). If no effective management table data are found in the management table area (1) here again, the processing is ended as an error is determined to have arisen.

If an effective management table is found in the management table area (1) at step S34, the management header is referenced, data in the table whose management header number is the largest in the management table area (1) are loaded onto the work RAM, and the address of that table is registered as the main table address (step S35). Then, the process shifts to table copying (step S40) to copy those table data into the management table area (0). In case data in one of the management table area have been destroyed, a situation in which effective data in both of the management table areas have been lost can be avoided by copying data in the other management table area.

If at step S22 above it is judged by checking the identification code that there are effective management table data in the management table area (0), the process shifts to step S23 to read management headers out of all the sectors in the management table area (0), to load onto the work RAM data in the table whose management header number is the largest, and to register the address of that table as the main table address (step S24). Next, the management table area (1) is searched (step S25). Then the identification code is checked to judge whether or not there are effective management table data (step S26). If no effective management table data are found in the management table area (1) here, the processing shifts to table copying at step S40 to copy the data read out of the management table area (0) into the management table area (1).

If it is judged at step S26 that there is an effective management table in the management table area (1), the process shifts to step S27 to read management headers out of all the sectors in the management table area (1), and compares the largest number among the management headers in the management table area (1) with the largest number among the management headers in the management table area (0) (step S28). If the largest management header in the management table area (1) is found greater, the process shifts from step S29 to step S30 to load table data in the sector whose management header is the largest in the management table area (1) onto the work RAM, to register the address of the pertinent table as the main table address, and at the same time to register the address of the table of the sector whose management header is the largest in the management table area (0) as the reserve table address (step S31). If it is judged at step S29 that the largest management header in the management table area (0) is greater than the largest management header in the management table area (1), the process shifts to step S32 to register the address of the table of the sector whose management header is the largest in the management table area (1) as the reserve table address.

Figure 13:
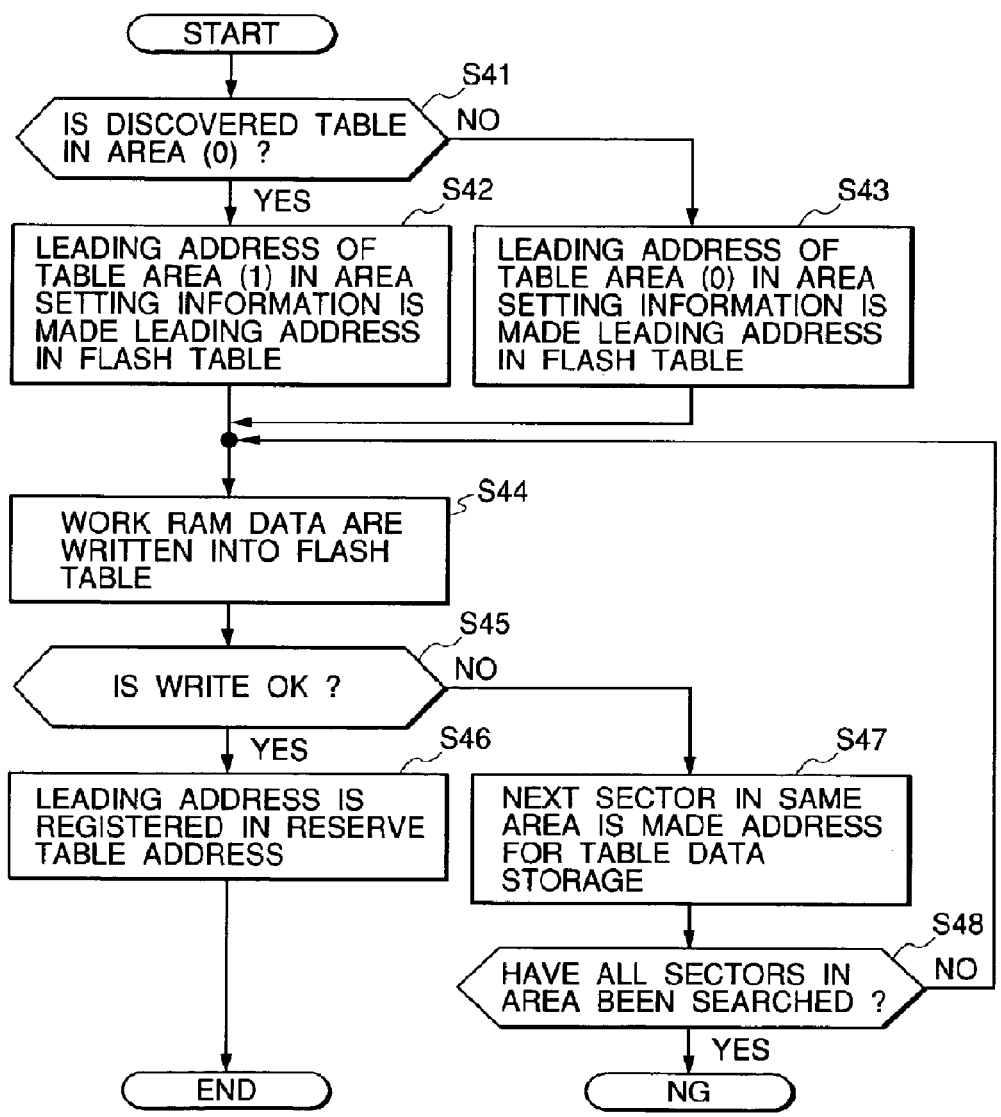
FIG. 13 is a flowchart showing a detailed procedure of table copying in the flow chart of FIG. 12.

FIG. 13 is a flow chart showing a detailed procedure of table copying at step 40 in the flow chart of FIG. 12.

In this table copying, it is first judged whether or not the discovered table is in the management table area (0) (step S41). If the discovered table is in the management table area (0), the leading address of the management table area (1) of area setting information is made the leading address stored in the table within the flash memory array at step S42. If the discovered table is in the management table area (1), the leading address of the management table area (0) of area setting information is made the leading address stored in the table within the flash memory array at step S43. Then, table data already loaded on the work RAM are written into the flash memory array from the aforementioned stored leading address onward (step S44).

It is then judged whether or not the writing has been normally completed and, if it has, the pertinent leading address is registered in the reserve table address column of the work RAM as the reserve table address (steps S45 and S46). If the writing was not normally completed at step S44, at step S47 the next sector in the same management table area is made the address at which table data are to be stored, and the process returns to step S44 to write the table data loaded on the work RAM. If writing into all the sectors in the management table area is tried but no normal writing of table data has been done, it is judged to be a write error and the processing is ended (step S48).

Figure 14:
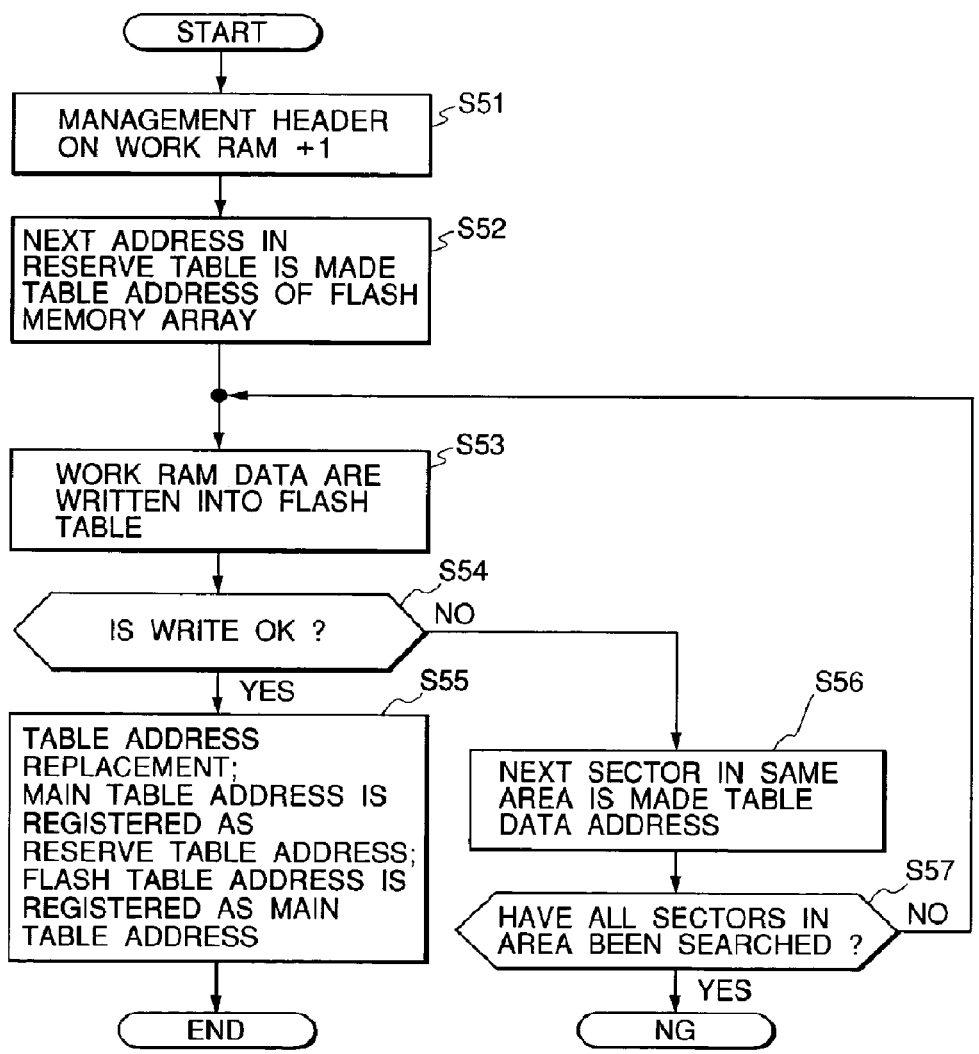
FIG. 14 is a flow chart showing the procedure in the flash memory of this embodiment to store data in the management table area out of the work RAM into flash memory array.

FIG. 14 shows the procedure of storing data in the management table area from the work RAM 135 into the flash memory array 121.

In this table storing, first the table management header on the work RAM is incremented (+1) (step S51). Then, the address next to the reserve table address is made the table storage address in the flash memory array step S52). Then, the table data on the work RAM 135 are written at the table storage address of the memory array (step S53).

Then it is judged whether or not the writing has been normally completed and, if it has, the table address is replaced. In other words, the main table address is registered in the reserve table address column of the work RAM as the reserve table address, and the latest table address of the flash memory array is registered in the reserve table address column of the work RAM as the main table address (steps S54 and S55). If the writing was not normally completed at step S54, at step S56 the next sector in the same management table area is made the address at which table data are to be stored, and the process returns to step S53 to write the table data stored within the work RAM into the flash memory array. If writing into all the sectors in the management table area is tried but no normal writing of table data has been done, it is judged to be a write error and the processing is ended (step S57). Incidentally, when the above-described table storing is to be executed when power supply is off, the table replacement at step S55 is unnecessary.

Figure 15:
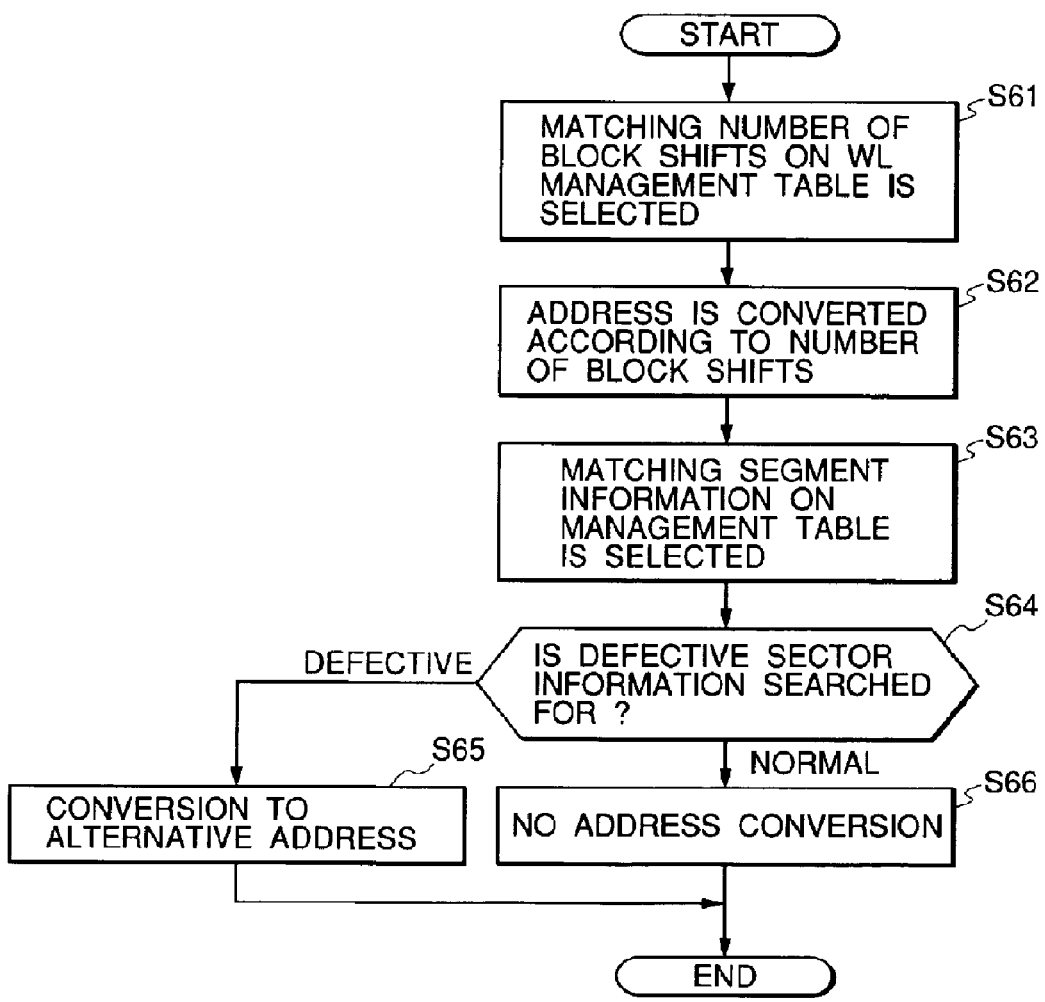
FIG. 15 is a flow chart showing the procedure of address translation in the flash memory of this embodiment.

FIG. 15 shows the procedure of address translation in the flash memory of this embodiment. This address translation is executed when a command to read, write data or erase data is entered.

In the address translation, first, numbers of rewrites averaging management information is read out of the work RAM, and the number of block shifts corresponding to the access address is selected (step S61). Next, according to the selected number of block shifts, the access address is translated (step S62). Then, the offset value is computed on the basis of the translated address, and management information of the corresponding segment on the defect management table is selected by using that offset value (step S63). Next, the management table is searched to judge whether or not the sector of the pertinent address is registered as a defective sector (step S64). If the sector to be accessed here is found registered as a defective sector, alternative address translation is performed to acquire the alternative sector address of the corresponding alternative segment (step S65). If the sector to be accessed at step S64 is found not registered as a defective sector, no address translation is performed, but this address is made final (step S66).

Figure 16:
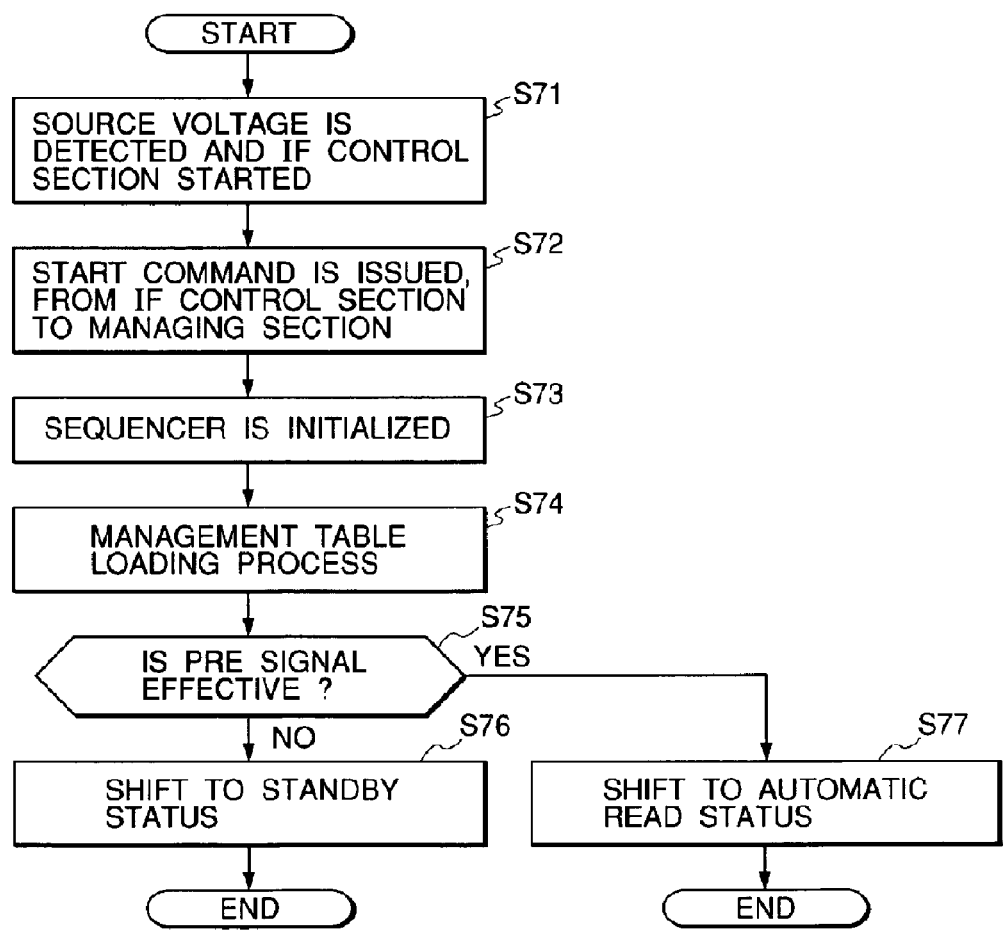
FIG. 16 is a flow chart showing the sequence of processing at the time of turning on power supply in the flash memory of this embodiment.

Next will be described the operation at the time of turning on power supply in the flash memory of this embodiment with reference to FIG. 16. The flash memory of this embodiment is provided in its host interface section 101, though this is not an absolute requirement, with a source voltage detecting circuit for detecting the source voltage level, a rise detection signal of the source voltage from this source voltage detecting circuit is supplied to the interface control section 110, and internal circuits are actuated (step S71). The interface control section 110, upon receiving the rise detection signal, issues an actuation command to the managing section 130 (step S72).

Then in the managing section 130, the sequencer 132 is initialized, and processing to load management table data from the flash memory section 120 onto the work RAM 135 is executed (steps S73 and S74). After the loading of the management table data is completed, a completion signal is sent from the managing section 130 to the interface control section 110, and the interface control section 110 judges whether or not a preload enable (PRE) signal, entered from an external device, is asserted at an effective level (e.g. a high level). If the PRE signal is not so asserted, the process shifts to a standby status in which a command input from the outside is waited for (steps S75 and S76).

If the PRE signal is asserted, the process shifts to an automatic read status in which data in the sector of address "0" in the flash memory array 121 can be supplied outside via a buffer memory 123A (step S77). Incidentally, the configuration is such that when the process shifts to the standby status of step S76 or the automatic read status, a signal /MRES indicating this operation is either ready or busy, supplied from a prescribed external terminal, varies to a high (or low) level.

Figure 17:
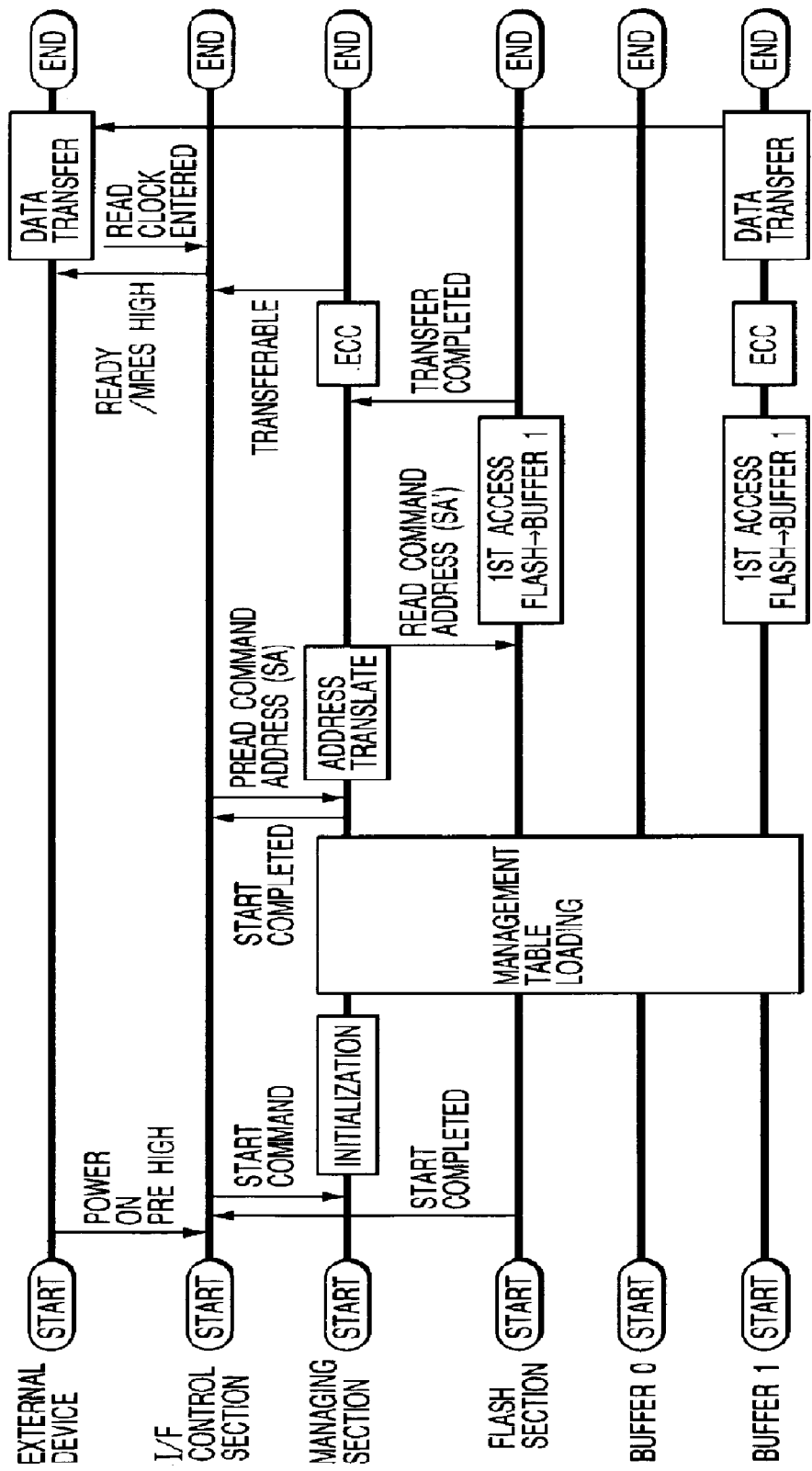
FIG. 17 is a timing chart showing the timing of automatic reading at the time of turning on power supply.

FIG. 17 shows the timing of automatic reading at the time of turning on power supply. This automatic reading is executed by having the external device assert the PRE signal at a high level in advance of turning on the power supply.

When the flash memory is actuated in a state in which the PRE signal is asserted at a high level at the time of turning on the power supply, the management table is loaded after an actuation command is sent to the managing section 130 and the managing section is initialized and, after the completion of loading an automatic read command and an address indicating "0" are supplied from the interface control section 110 to the managing section 130. Then, the sequencer 132 references this management table, performs address translation if necessary, and supplies the translated address and the read command to the flash memory section 120. Data in the sector of address "0" in the flash memory array 121 are read out and stored into the buffer memory 123A.

Next, the sequencer 132 sends the data that have been read out to the ECC circuit 136 to have them checked for errors and any error corrected. Upon completion of ECC processing, a signal indicating transferability is sent from the managing section 130 to the interface control section 110, and the interface control section 110 varies the signal /MRES indicating this operation to be either ready or busy, supplied from the host interface section 101, to a high level. When the external device detects the variation of this signal /MRES and enters a read clock RCK into the flash memory, data held in the buffer memory 123A are transferred to the external device via the host interface section 101.

Figure 18:
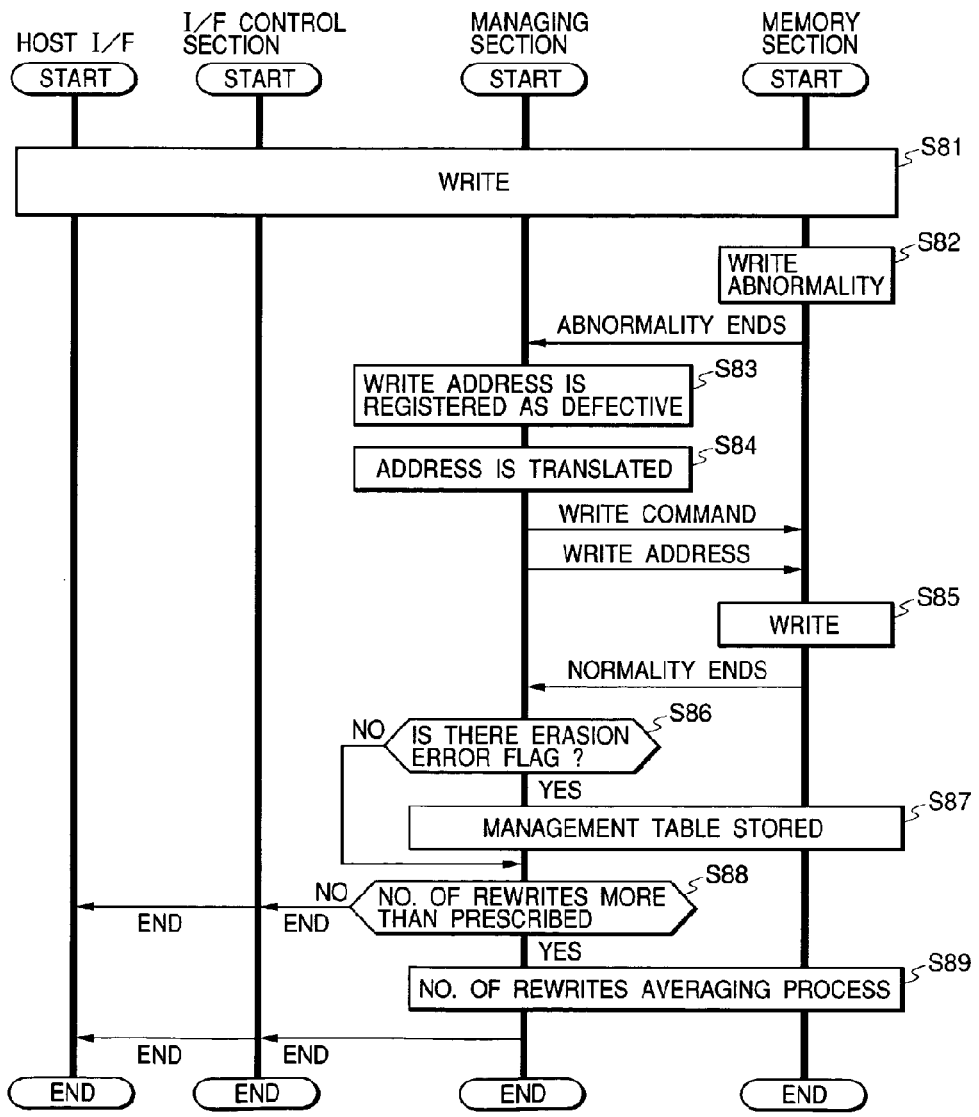
FIG. 18 is a flow chart showing the procedure that is taken if any abnormal writing arises in write processing in the flash memory of this embodiment.

FIG. 18 shows the procedure that is taken if any abnormal writing arises in write processing. It has to be noted that, in this specification, the terms "writing" and "rewriting" are differentiated from each other by referring to writing data into all the memory cells in the data area of one sector as "writing" and to writing data into only some memory cells in the data area of one sector as "rewriting".

When a write operation (step S81) in response to a write command from the external device has ended and any abnormal writing is detected by a verify operation, a signal to notify the abnormal ending is sent from the memory section 120 to the managing section 130 (step S82). Then, the managing section registers the pertinent write address in the management table of the work RAM 135 as a defective address (step S83). The managing section performs address translation to replace it with a normal address in the alternative area, and sends the translated address as the write address to the memory section 120 together with a write command (step S84). Then, the memory section executes writing in the replacing sector (step S85). Upon normal ending of the writing, a signal to notify the normal ending is sent from the memory section to the managing section.

Next, the managing section checks whether or not an erasion error flag is standing and, if one is, stores the management table the work RAM into the flash memory array (steps S86 and S87). If no erasion error flag is standing or if, after storing the management table into the flash memory array, the number of times the sector whose management table has been rewritten is checked and is found not to have reached a prescribed level, an end signal is sent to the interface control section, and the interface control section so controls the host interface section as to supply the end signal outside the chip (step S88). If the number of times the sector has been rewritten is found to have reached the prescribed level, after block shifting is carried out by averaging the numbers of rewrites, the end signal is sent to the interface control section, which so controls the host interface section as to supply the end signal outside the chip (step S89).

To add, regarding the erasion flag, since data in the sector into which writing is to be done is erased by the write operation at step S81, if any abnormality arises in that data erasion, an erasion flag will be erected and, at the same time, replacement is performed to update the management table within the work RAM. Therefore in this embodiment, it is checked whether or not the erasion error flag is standing after the end of writing and, if it is, the management table within the work RAM is stored into the flash memory array.

Figure 19:
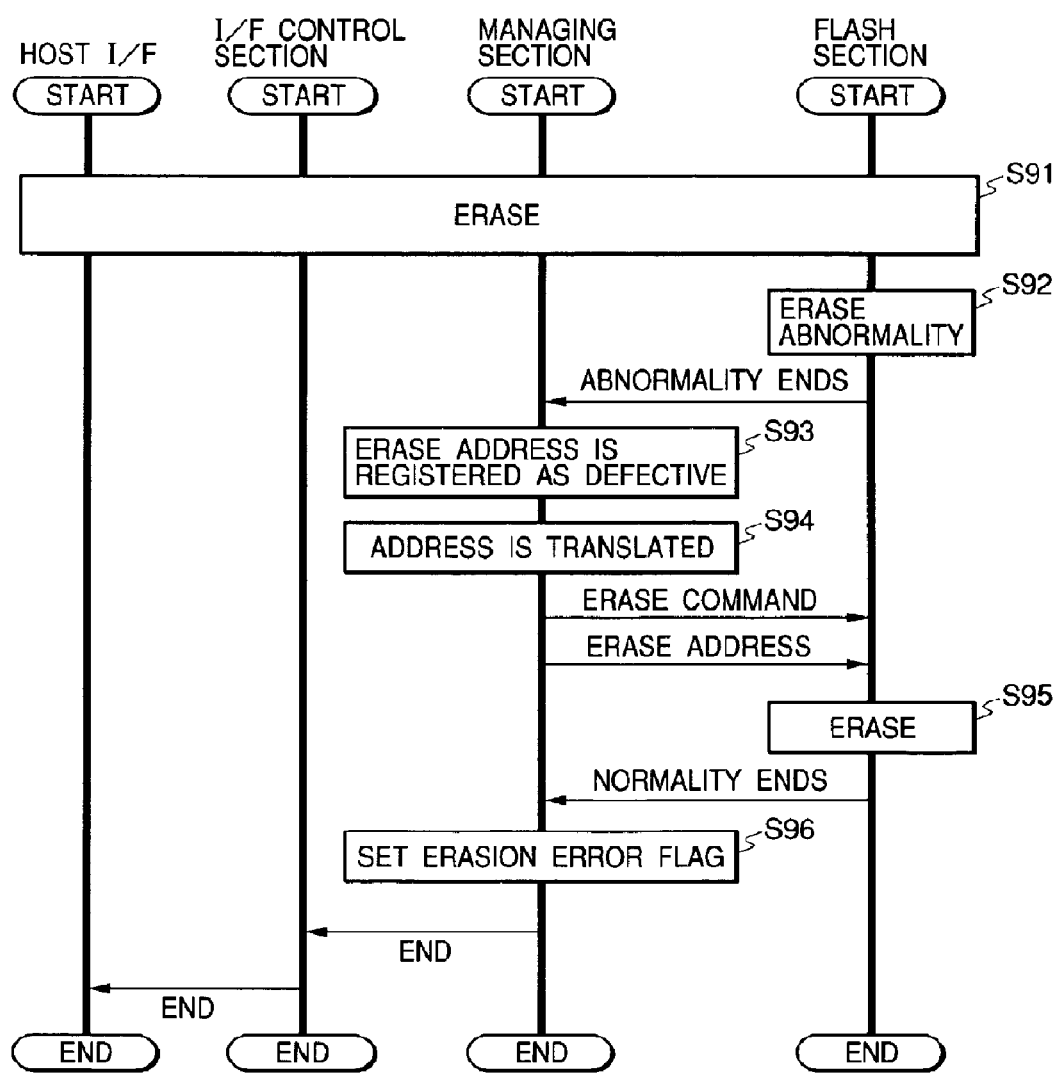
FIG. 19 is a flow chart showing the procedure that is taken if any abnormal erasion arises in erase processing in the flash memory of this embodiment.

FIG. 19 is a flow chart showing the procedure that is taken if any abnormal erasion arises in erase processing in the flash memory of this embodiment. Incidentally this erase processing covers both erasion by an erase command and temporary erasion before writing by a write command from the external device.

When the operation to erase data in a sector designated according to an erase command or a write command from the external device (step S91) has ended and any abnormality in erasion is detected by a verify operation, a signal to notify the abnormality is sent from the memory section 120 to the managing section 130 (step S92). Then, the managing section registers the pertinent erase address or write address in the management table within the work RAM as a defective address (step S93). Then it performs address translation for replacement by a normal sector in the alternative area and, using the translated address as the erase address, sends an erase command and address to the memory section (step S94). The memory section executes erasion on the replacing sector (step S95). Upon normal ending of the erasion, a signal to notify the normal ending is sent from the memory section to the managing section. Though this is not an absolute requirement, the managing section may, when a signal to notify the normal ending has been received at step S92, perform processing to raise the threshold voltage of memory cells in the sector in which the pertinent erasion has taken place to increase the threshold voltage of any memory cell less than 0 V (a depleted state) to above 0 V.

Next the managing section, after erecting the erasion error flag, sends an end signal to the interface control section, and the interface control section so controls the host interface section as to supply the end signal outside the chip (step S96). Incidentally, when erasion has been done in response to a write command, the process shifts to write processing of FIG. 18 without supplying the end signal.

Figure 20:
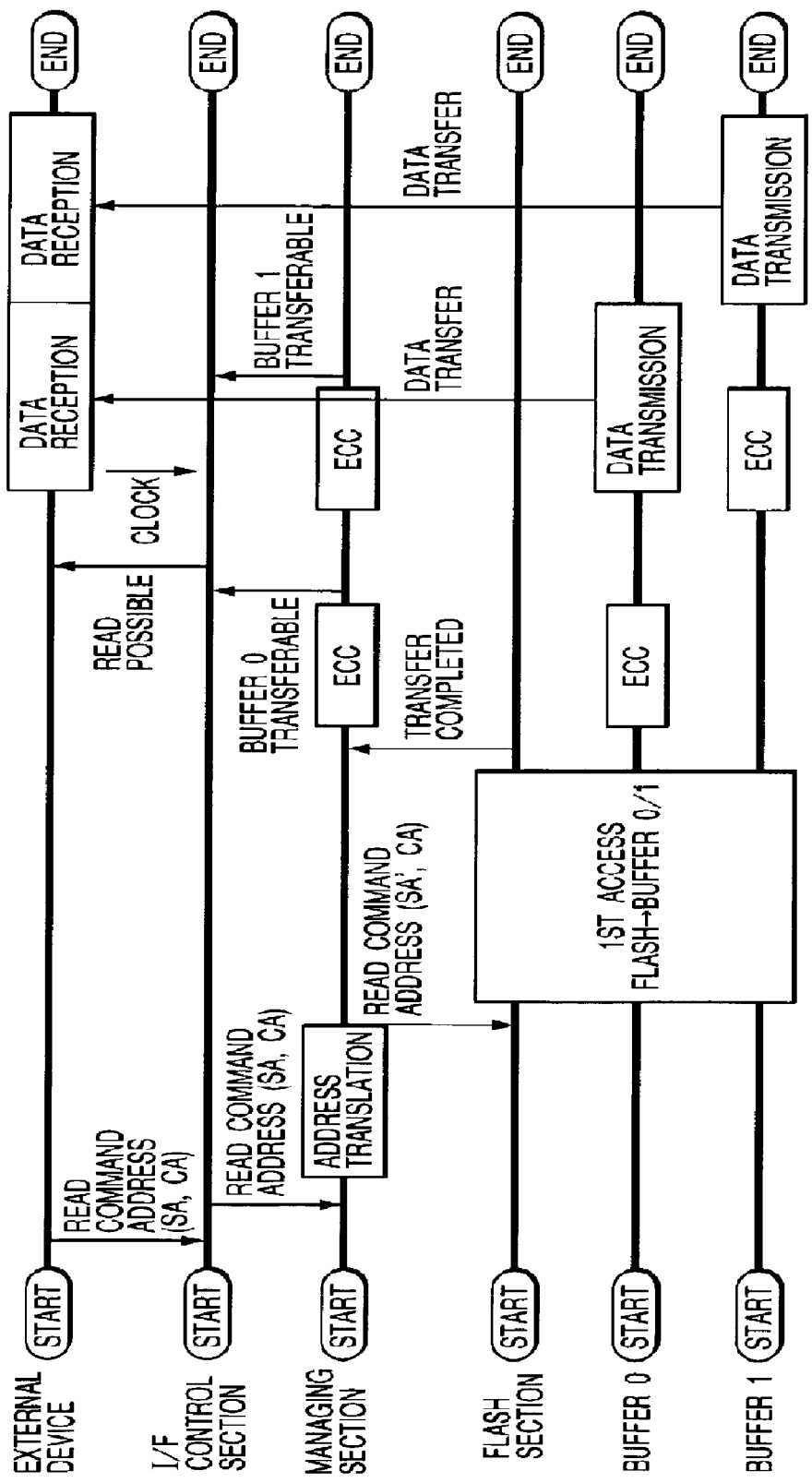
FIG. 20 is a timing chart showing the flow of usual data reading operation in the flash memory of this embodiment.

FIG. 20 shows the flow of usual data reading operation in the flash memory of this embodiment. This usual data reading is started by the inputting of a read command and a read address from the external device to the flash memory. The read address consists of a sector address SA and a column address CA designating any byte data in the sector.

The entered read command controls the interface control section to be sent to the managing section, which performs address translation by using the management table. This address translation involves the address having undergone block shifting by the averaging of the numbers of rewrites and the replacing address resulting from the defective address replacement. After the address translation, the read command and translated addresses SA' and CA are sent from the managing section to the memory section. Then in the memory section, data in a designated sector of the flash memory array 121 and data in the next sector are read out, and held in the buffer memories 123A and 123B, respectively.

Upon completion of reading data out to the buffer memories, a signal to notify the completion is sent from the memory section to the managing section and, in response to this signal, the managing section controls the DMA transfer control circuit 137 and the ECC circuit 136 to perform error detection and correction for data in the buffer memory 123A first. Upon completion of this ECC processing, the managing section notifies the interface control section of transferability, and the interface control section informs of the external device of the readiness by using a read/busy signal /RB.

Then, in response to the inputting of a clock from the external device, data in the buffer memory 123A are supplied outside the chip, and transferred to the external device. In parallel with the data transfer, error detection and correction processing is executed for data in the buffer memory 123B. Upon completion of this ECC processing, the interface control section is informed of the transferability of data in the buffer memory 123B. Upon completion of the transfer of data in the buffer memory 123A, the transfer of data in the buffer memory 123B is started in response to a request from the external device.

Figure 21:
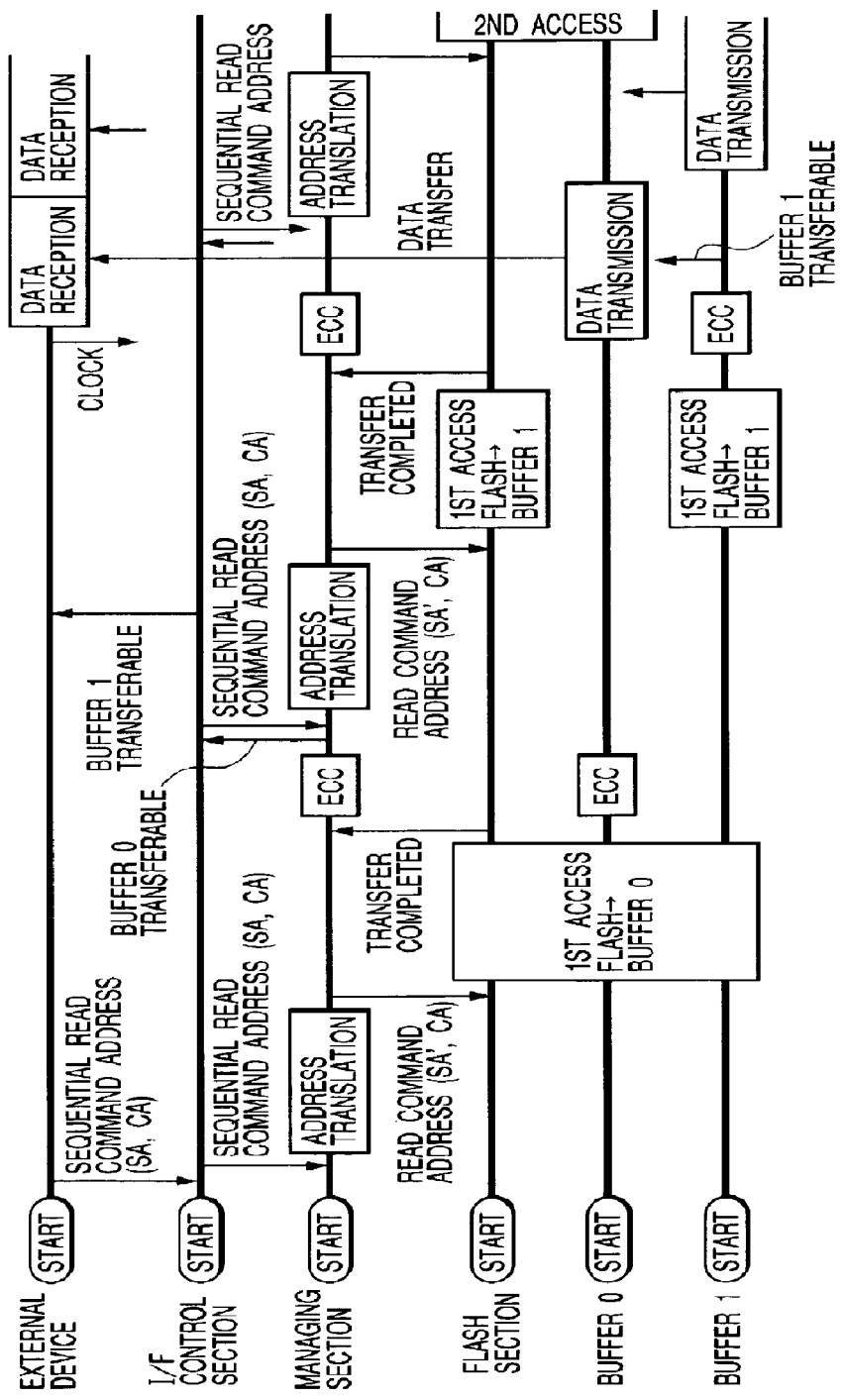
FIG. 21 is a timing chart showing the flow of sequential data reading operation in the flash memory of this embodiment.

FIG. 21 shows the flow of sequential reading operation in the flash memory of this embodiment. This sequential reading is a function that is actuated by the inputting of a sequential read command and read address from the external device to the flash memory, and can read out all the data from the read address onward as long as the external device continues inputting the clock. The sequential reading is done in a procedure of usual reading illustrated in FIG. 20.

The sequential reading differs from the usual reading shown in FIG. 20 as described below. In the usual reading shown in FIG. 20, data are first read out to the first buffer memory 123A and the second buffer memory 123B and, while the data in the buffer memory 123A are being externally transferred, those in the buffer memory 123B are subjected to error correction. In the sequential reading, data reading to and error correction in the buffer memory 123A are performed; while the external device is being informed of the transferability, data reading to the buffer memory 123B is performed; and while data in the buffer memory 123A are being externally transferred, data in the buffer memory 123B are subjected to error correction. Another feature of the sequential reading is that, every time a data transfer from one of the buffer memories is completed, a sequential read command is sent from the interface control section to the managing section.

Figure 22:
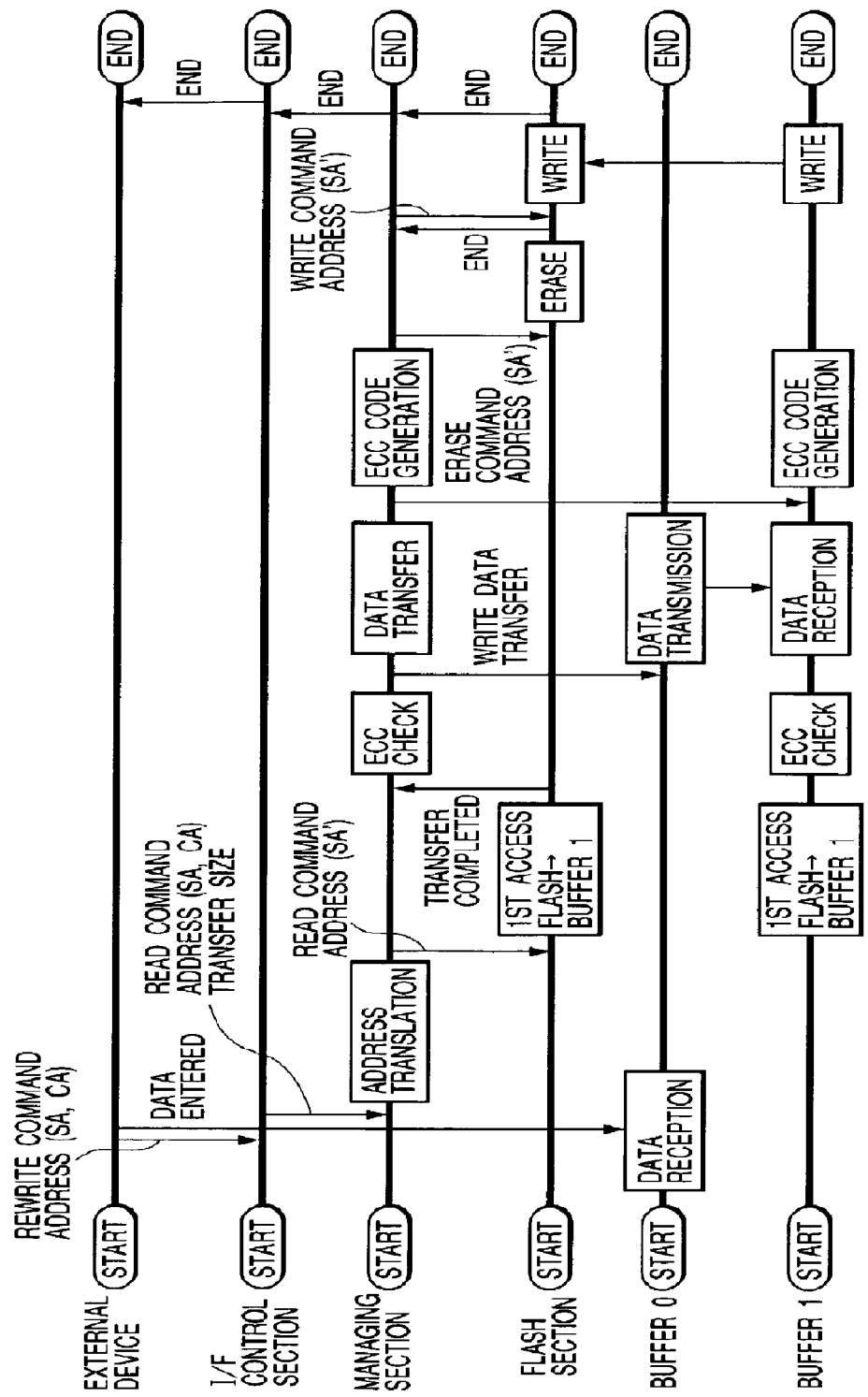
FIG. 22 is a timing chart showing the flow of data rewriting operation in the flash memory of this embodiment.

FIG. 22 shows the flow of data rewrite operation in the flash memory of this embodiment. Data rewriting is started by the inputting of a rewrite command, a rewrite address and rewrite data from the external device to the flash memory. While the write address consists only of a sector address SA for designating a sector, the rewrite address consists of a sector address SA and a column address CA for designating any desired byte data in the sector. The entered rewrite data are once stored into the buffer memory 123A. The interface control section, upon receiving the rewrite command, issues a read command to the managing section and at the same time counts the number of bytes of the rewrite data to be entered to inform the managing section of the size of the data to be transferred.

Then the managing section performs address translation by using the management table, and sends to the memory section the read command and the translated addresses SA' and CA. In the memory section, data (of 2096 bytes) in the data area in the designated sector of the flash memory array 121 and management data (of 16 bytes) in the sector management area are read out, and held in the buffer memory 123B. Upon completion of the reading of data into the buffer memory 123B, a signal to notify the completion is sent from the memory section to the managing section, and in response to this signal the managing section controls the DMA transfer control circuit 137 and the ECC circuit 136 to perform error detection and correction for data in the buffer memory 123B.

Then, upon completion of the ECC processing, the managing section controls the DMA transfer control circuit 137 to transfer the rewrite data held in the first buffer memory 123A to the second buffer memory 123B and to synthesize the data. More specifically, out of the data of 2162 bytes of one sector read out of the flash memory array, data in the position designated by the external device by the column address CA are replaced by the rewrite data held in the first buffer memory 123A. Then, the managing section controls the DMA transfer control circuit 137 and the ECC circuit 136 to generate an ECC code for the rewritten data in the second buffer memory 123B.

After that, an erase command and address are sent to the memory section to have data in the sector to be rewritten erased. Upon completion of the erasion, as a completion signal is supplied from the memory section to the managing section, the managing section causes data in the buffer memory 123B to be written into the sector to be rewritten by sending a write command and address to the memory section. Upon completion of the writing, as a completion signal is supplied from the memory section to the managing section, the managing section sends the completion signal to the interface control section, and the interface control section controls the host interface section to supply the completion signal to the external device.

Figure 23:
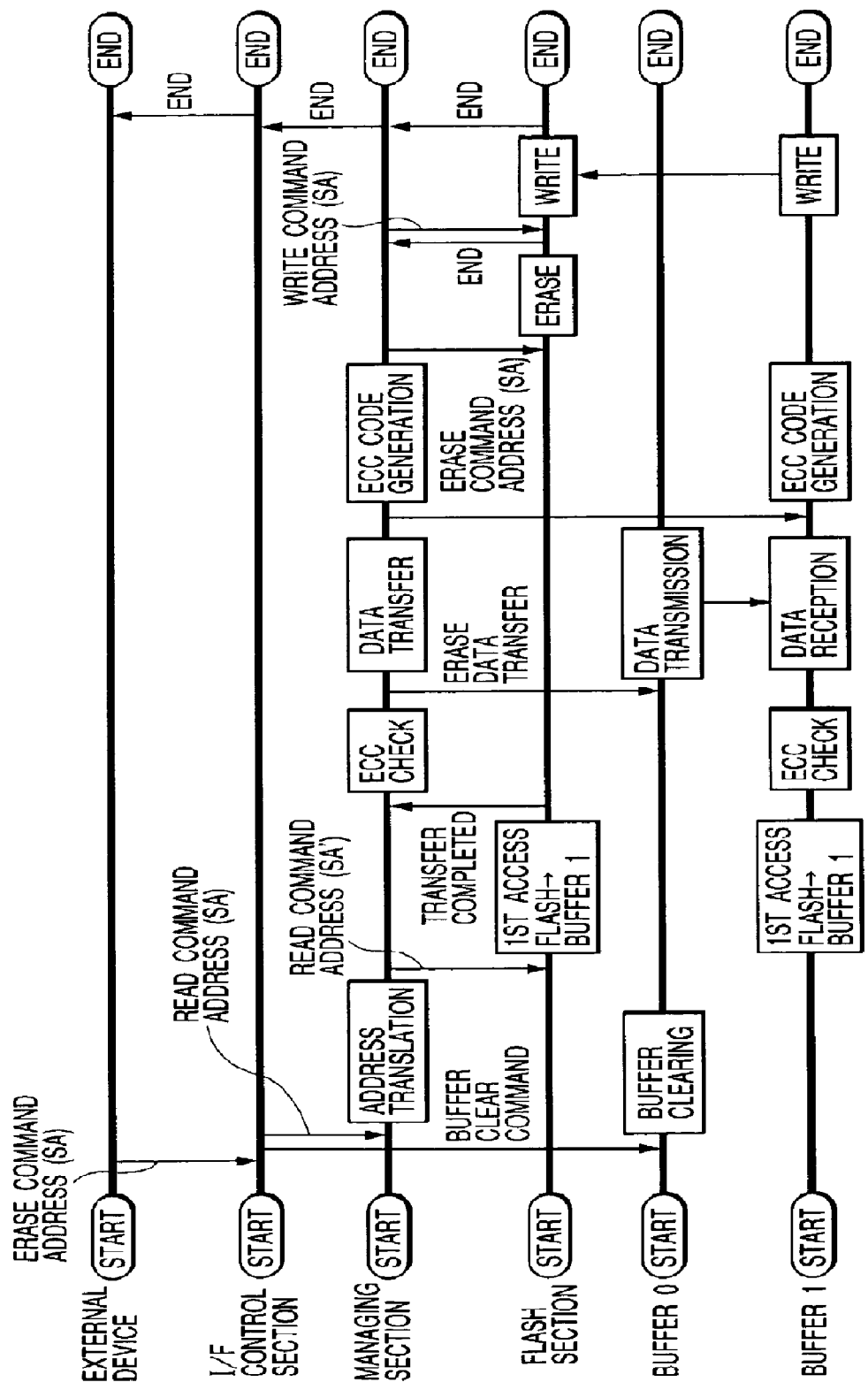
FIG. 23 is a timing chart showing the flow of data erasing operation in the flash memory of this embodiment.

FIG. 23 shows the flow of data erase operation in the flash memory of this embodiment. The erasion of data is started by the inputting of an erase command and an erase address from the external device to the flash memory. Incidentally in this embodiment of the invention, erasion is carried out on a sector-by-sector basis.

When the erase command is entered, a clear signal is sent from the interface control section 110 to the first buffer memory 123A to clear it of all the data, and at the same time a read command and address are sent to the managing section 12. This address is an address to designate the sector subject to erasion. The purpose of sending the read command is to set aside management information into the buffer memory in advance because, as shown in FIGS. 6(A) to 6(C), each sector has a management area for storing sector management information in addition to the data area for storing data as such, and erasion on a sector-by-sector basis would result in erasion of this management information together.

Upon receiving the read command, the managing section performs address translation by using the management table, and sends the read command and the translated addresses SA' and CA to the memory section. In the memory section, data (of 2096 bytes) of the data area 121 and management data (of 16 bytes) in the sector management area of a designated sector in the flash memory array are read out and held in the second buffer memory 123B. Upon completion of the data into the buffer memory 123B, a signal to notify the completion is sent from the memory section to the managing section and, in response to this signal, the managing section controls the DMA transfer control circuit 137 and the ECC circuit 136 to perform error detection and correction for the buffer memory 123B.

Upon completion of the ECC processing, the managing section controls the DMA transfer control circuit 137 to transfer clear data (data corresponding to the erased state of memory cells) held in the first buffer memory 123A to the second buffer memory 123B and to synthesize data. More specifically, out of the 21162 bytes of data in one sector read out from the flash memory array, 2096 bytes of data excluding the 16-byte sector management information stored in the sector management area replace the clear data held in the first buffer memory 123A. Then, the managing section controls the DMA transfer control circuit 137 and the ECC circuit 136 to generate an ECC code for the rewritten data in the second buffer memory 123B.

After that, an erase command and address are sent to the memory section to have data in the sector to be rewritten erased. Upon completion of the erasion, as a completion signal is supplied from the memory section to the managing section, the managing section causes data in the buffer memory 123B to be written into the sector to be rewritten by sending a write command and address to the memory section. This causes the ECC code and the sector management information, which has been set aside in the buffer memory 123B, to be written into the designated sector. Upon completion of the writing, as a completion signal is supplied from the memory section to the managing section, the managing section sends the completion signal to the interface control section, and the interface control section controls the host interface section to supply the completion signal to the external device.

Figure 24:
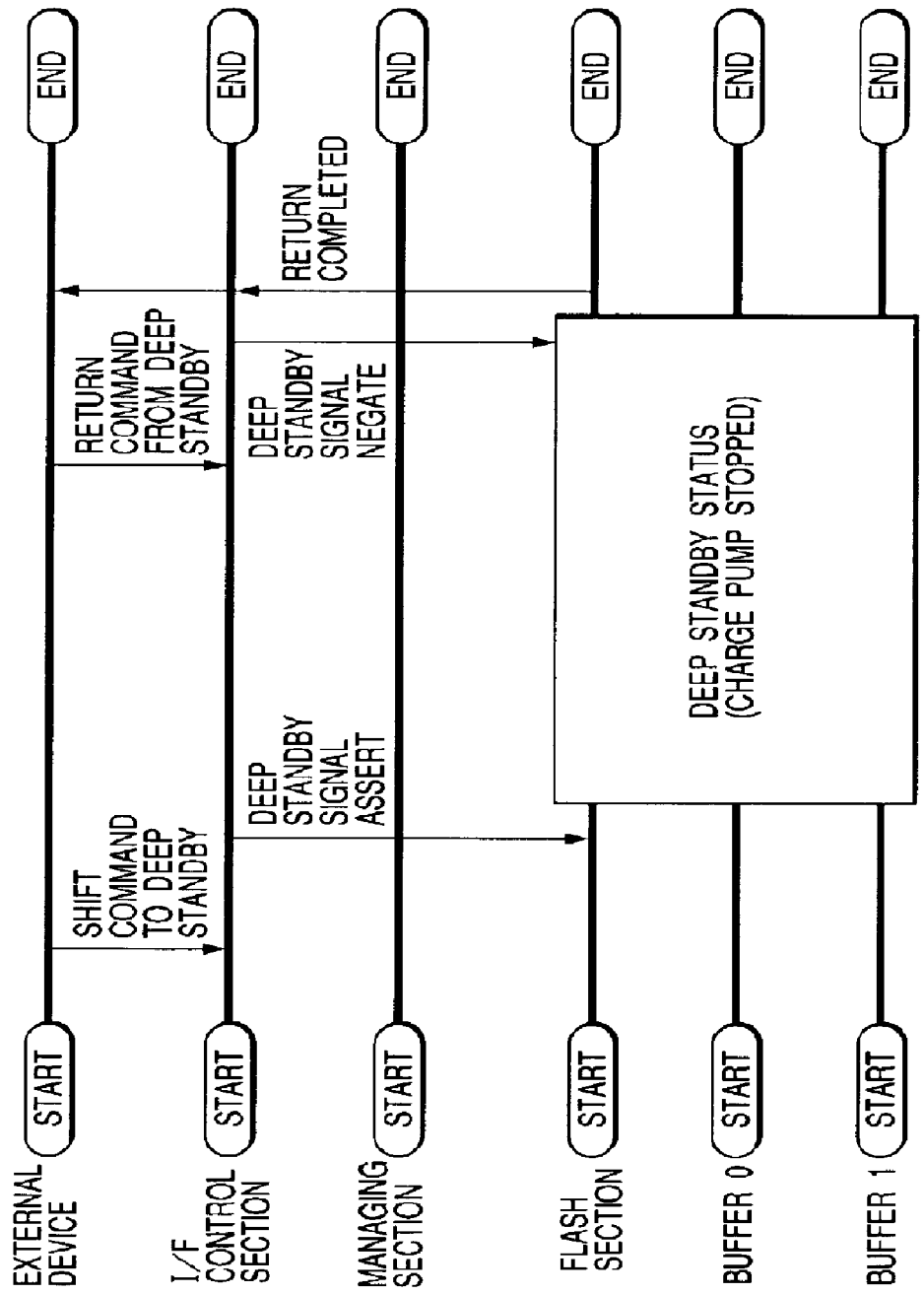
FIG. 24 is a Liming chart showing the flow of operation to shift to the deep standby mode and that to return from the deep standby mode to the usual operation mode in the flash memory of this embodiment.

FIG. 24 shows the flow of operation to shift to the deep standby mode and that to return from the deep standby mode to the usual operation mode in the flash memory of this embodiment.

In the flash memory of this embodiment, there is available a deep standby mode for completely turning off a boosting charge pump within the power supply circuit 122 of the memory section 120, a command for shifting the chip to the deep standby mode, and a command for returning it from the deep standby mode. When a command to shift to deep standby is entered from the external device to the flash memory, a deep standby signal to instruct a shift to the deep standby mode is asserted from the interface control section to the memory section.

Then, the memory section either interrupts a clock supplied to the boosting charge pump within the power supply circuit 122 or stops the operation of the clock generator circuit to turn off the charge pump. The flash memory is thereby placed in a state in which its power consumption is kept extremely small. When a command for returning from the deep standby is entered from the external device to the flash memory, the deep standby signal supplied from the interface control section to the memory section is negated. Then, the memory section restarts the clock supply to the boosting charge pump within the power supply circuit 122 or actuates the clock generator circuit to turn on the charge pump. It is thereby made possible to generate a high voltage needed for writing into the memory array or erasing data therein.

Figure 25:
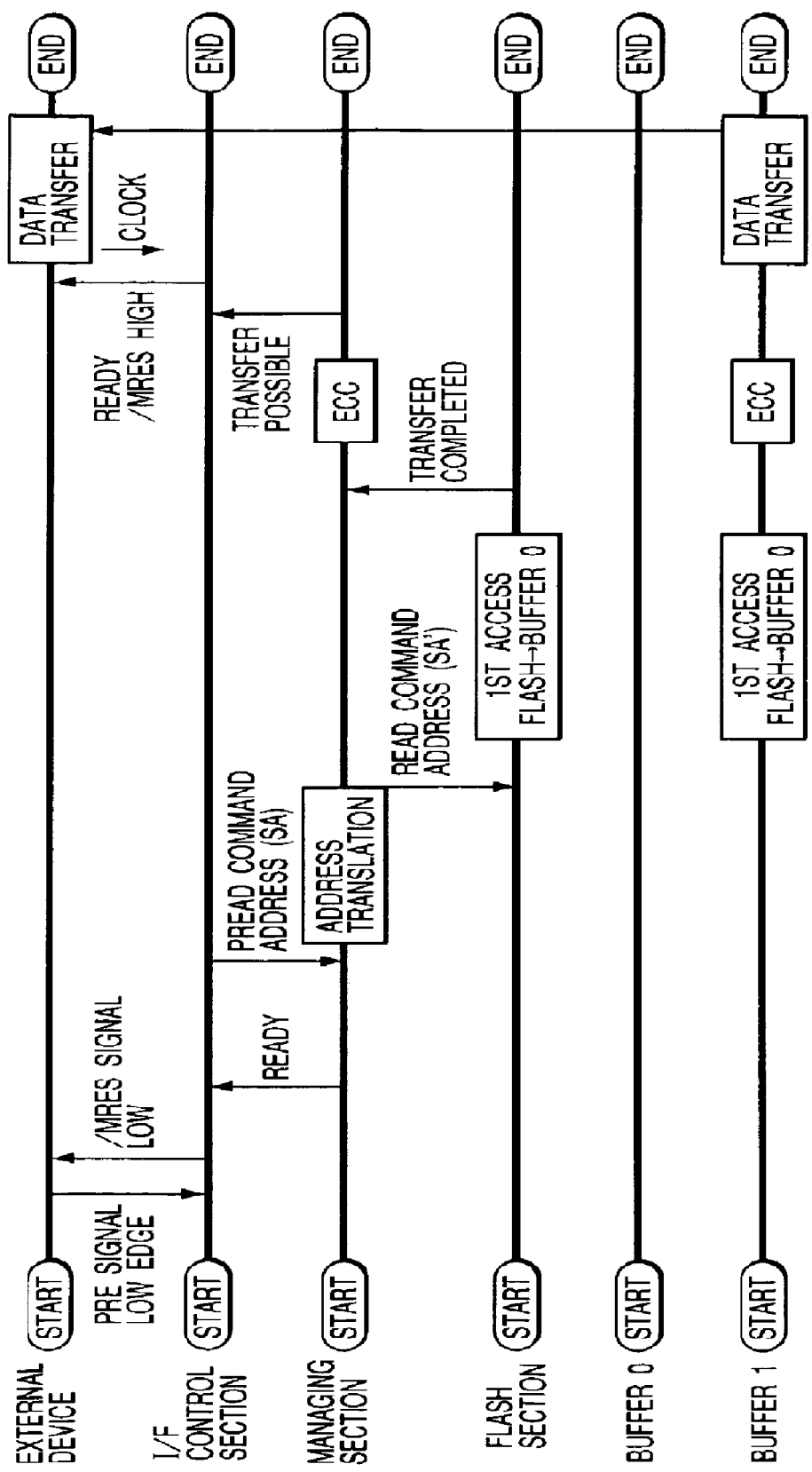
FIG. 25 is a timing chart showing the flow of operation known as hot restart that takes place at the time of turning on power supply in the flash memory of this embodiment.

FIG. 25 shows the flow of operation known as hot restart that takes place at the time of turning on power supply in the flash memory of this embodiment (see FIG. 17).

In the automatic reading at the time of turning on power supply shown in FIG. 17, a read command and an address "0" in the memory array 121 are supplied from the interface control section 110 to the managing section 130 after the completion of the loading of the management table, and the data at the leading address in the memory array are read out and supplied externally. Unlike that, in the hot restart shown in FIG. 25, when a PRE signal inputted to a prescribed external terminal of the flash memory varies to a low level, after the signal /MRES indicating this operation is either ready or busy is varied to a low level, a read command and an address "0" in the memory array are sent to the managing section without loading the management table, and data at the leading address in the memory array are read out and supplied externally. The reason why the management table is not loaded is that the hot restart is an operation that is done while power supply is on and the management table that was loaded when power supply was turned on is already held on the work RAM.

Figure 26:
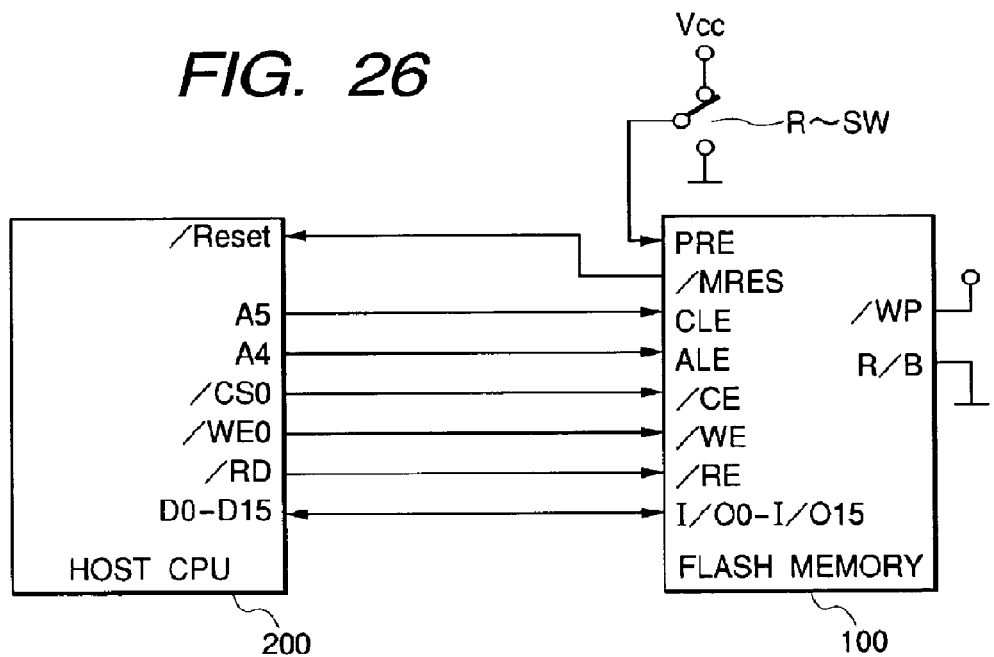
FIG. 26 is a diagram illustrating an example of system configuration using the flash memory of this embodiment.

The PRE signal may be varied to a low level by the external device, such as a host CPU, but another conceivable configuration is that, as shown in FIG. 26, a reset switch R-SW is connected to an external terminal, to which the PRE signal is inputted, of a flash memory 100, and a signal /MRES indicating either a ready or a busy state supplied from the flash memory 100 is inputted to the reset terminal of a host CPU 200, wherein the flash memory is enabled to function as a boot device by storing at the leading address ("0") of the memory array of the flash memory the program to be executed first at the time of actuating the system.

Figure 27A:
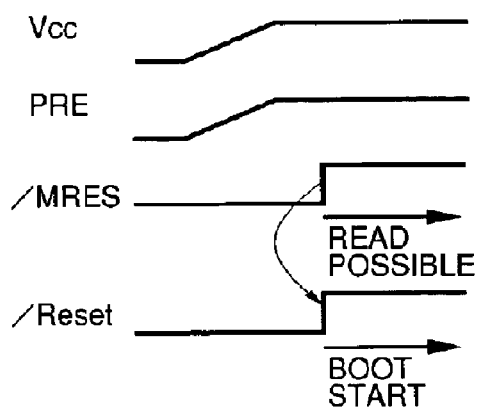
FIGS. 27(A) and 27(B) are timing charts showing the signal timings between the CPU and the flash memory in the system of FIG. 26.

For instance, if the power source of the system is actuated by turning on a power switch (not shown) in a state in which the reset switch R-SW is set to the source voltage terminal Vcc as shown in FIG. 26, the PRE signal rises to a high level with the rise of the source voltage Vcc as shown in FIG. 27(A). As a result, the flash memory, when it enters into a state in which it can automatically read data at address "0" in the memory array in accordance with the operation shown in FIG. 17 and supply them outside the chip, varies the signal /MRES indicating either a ready or a busy state to a high level, that indicates a ready state. In the system illustrated in FIG. 26, as this signal is inputted to the reset terminal of the host CPU, the CPU is released from the reset state, and enabled to start a boot operation to read data out of the flash memory.

Figure 27B:
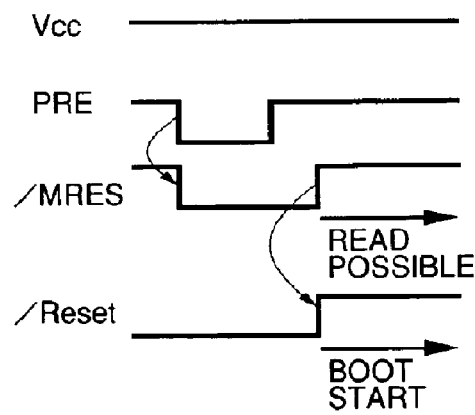

If the reset switch R-SW is changed over to the ground side while power supply is on, the PRE signal will fall to a low level as shown in FIG. 27(B), and therefore the flash memory then automatically reads out data at address "0" in the memory array after first varying the signal /MRES to a low level in accordance with the operation of hot restart shown in FIG. 25. When it comes to a state in which it can supply outside the chip the data that have been read out, the signal /MRES is varied to a high level. In the system of FIG. 26, as this signal is inputted to the reset terminal of the host CPU, the CPU is released from the reset state, and enabled to start a boot operation to read data out of the flash memory.

Next will be described other functions the flash memory of this embodiment is provided with.

Figure 28A:
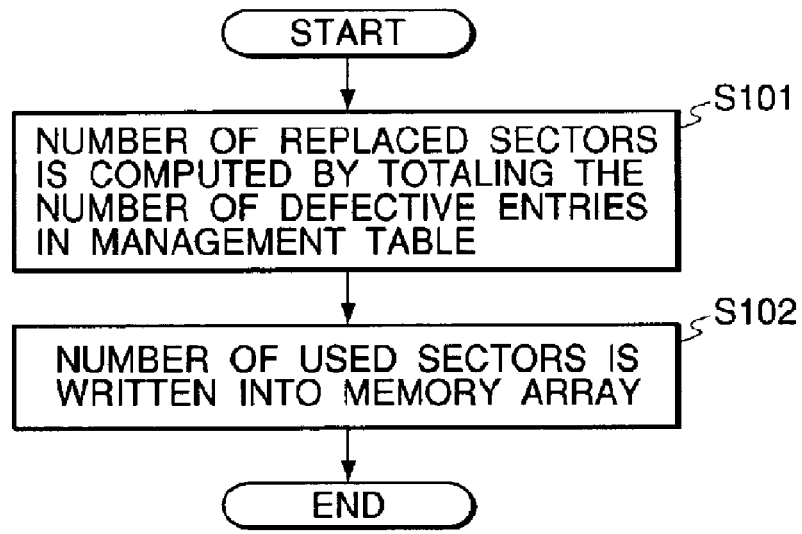
FIGS. 28(A) and 28(B) are flowcharts showing the procedure of operation taken when test commands have been entered in the flash memory of this embodiment.
Figure 28B:
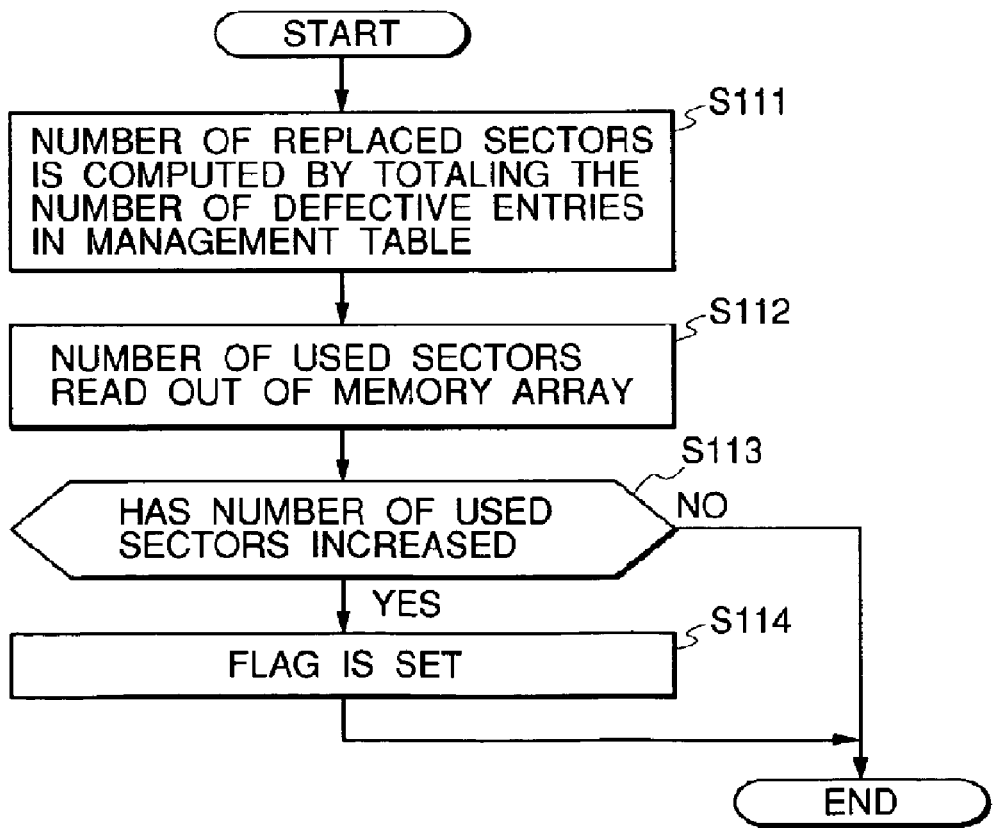

The flash memory of this embodiment is provided with a plurality of commands for testing use. FIGS. 28(A) and 28(B) show the procedures of operation when one or the other of two such commands for testing use have been entered. When a first test command is entered, as shown in FIG. 28(A), the managing section 130 computes the total number of alternative sectors by referencing the reserve alternative area management information (FIG. 7(C)) of the management table in the flash memory array 121 and adding the number of entries (step S101), and writes the number of already used alternative sectors in the alternative area into the regular area of the flash memory array (step S102). Therefore, by reading out this number of used alternative sectors when sorting products and determining those products in which the number of unused alternative sectors is less than a prescribed level, it is made possible to guarantee a number, not below a certain level, of defective sectors which can be replaced in a state of normal use and thereby to enhance the reliability of products.

When a second test command is entered, as shown in FIG. 28(B), the managing section 130 computes the total number of alternative sectors by referencing the reserve alternative area management information (FIG. 7 (C)) of the management table in the flash memory array 121 and adding the number of entries (step S111), at the same time reads out the number of used alternative sectors written into the memory array when the first test command was entered (step S112), judges whether or not the number of used alternative sectors has increased(step S113) and, if it has, sets a flag (step S114) or, if it has not, ends the processing without setting a flag. This flag can prevent products whose defective sectors increase in a short period of time from being shipped as satisfactory products by, in conducting an aging test for instance, entering the first test command before the aging test, inputting the second test command after that test to finalize the flag, referencing the flag in subsequent sorting, and determining products with an erected flag to be defective products.

It is also conceivable to write the number of used alternative sectors at step S102 of FIG. 28(A) into the work RAM 135 instead of into the flash memory array. It is also conceivable to provide either in the flash memory array 121 or in the work RAM 135 the flag to be set at step S119 of FIG. 28(B). The determination of any increase in the number of used alternative sectors at step S113 of FIG. 28(B) may merely concern whether or not there has been any increase but may as well concern whether or not the increase is by a prescribed number or more.

Figure 29:
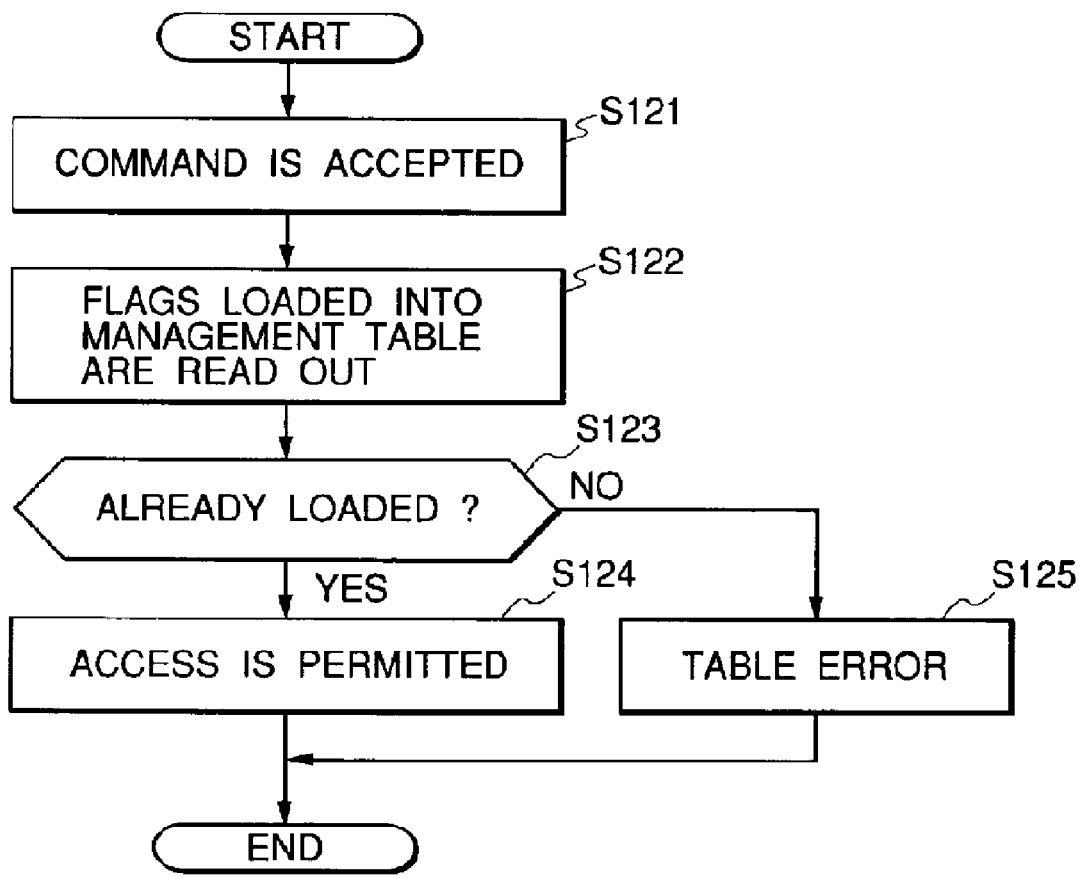
FIG. 29 is a flow chart showing the sequence of processing at the time power supply is turned on in the flash memory of another embodiment of the invention.

Next will be described another flash memory which embodies the present invention in a different mode. In this embodiment, if the management table to be loaded from the flash memory array onto the work RAM at the time of turning on power supply fails to be normally read out, access to the memory array will be refused. A conceivable way to realize this is, for instance, to so configure the managing section that it can execute processing to judge whether or not the management table has been normally read out and, if it has been, to set a flag and processing, as shown in FIG. 29, to reference a flag indicating the completion of management table loading (step S122) when a command to access the flash memory array has been entered (step S121) thereby to check whether or not the table is normally loaded (step S123), and to permit access to the flash memory array only when the table is normally loaded (step S124) or to refuse access to the flash memory array when the table is not normally loaded, to issue a signal indicating a table error (step S125) or to set a prescribed bit in a status register.

Although the invention made by the present inventor has been described in specific terms with reference to embodiments thereof, obviously the invention is not confined to these embodiments, but can be varied in many different ways without deviating from its essentials. Each of the embodiments described above is a binary flash memory in which each memory element (memory cell) can store data of one bit each, but the invention can also be applied to a multiple value flash memory in which each memory element can store data of two or more bits each.

Further, although the foregoing description of the embodiments did not touch on the specific configuration of the memory array, the invention can be applied not only to the so-called AND type or NOR type flash memory in which a plurality of memory elements are connected in parallel between bit lines and source lines but also the so-called NAND type flash memory in which memory elements are connected in series. The invention is further applicable to not only two-layered gate type memory cells each having a floating gate and a control gate but also to MONOS type memory cells each having a charge accumulating layer, consisting of a nitride film, between a control gate and a channel. In this case, electric charges may be accumulated in either the whole charge accumulating layer to store information of one bit each or part of the charge accumulating layer to store information of two or more bits each.

Regarding the embodiments of the invention, while NAND/AND/SAND type flash memories in each of which address information and data are multiplexed and inputted/outputted via the same I/O terminal have been described in specific terms, such memory may be further be provided with a flash memory interface in which address and data are separately inputted/outputted via different I/O terminals. In that case, terminals indicating the type of interface may be further provided, or the selection can be triggered by the failure to select any terminal indicating the type of interface, described with respect to the embodiments. Also, some of the I/O terminals, for instance I/O [15:8], can be used as address terminals and others, [7:0], as data terminals.

While the foregoing description concerned the invention achieved by the present inventor mainly with respect to flash memories, which constitute the background field of the invention, the invention is not limited to what has been described above, but can be extensively utilized for semiconductor memories having nonvolatile memory elements which store information by applying a voltage and varying the threshold voltage.

Advantages achieved by the invention disclosed in this application in its typical aspects will be briefly described below.

Thus, as the nonvolatile memory has a replacing function and an error correction according to the invention, there is no need to have an external controller process replacement or error correction, it is made possible to reduce the load on the system developer and, since a plurality of sets of information address translation are stored, it is made possible to avoid, even if any set of address translation information is lost, an abnormal state in which the system becomes unable to operate by having another set of such information to be substituted for the lost information.

Furthermore, because a plurality of sets of information address translation are stored in succession in two or more areas, even if data in any area storing address translation information is lost as a result of a writing or erasing operation, address translation information stored in other areas is not lost, so that an abnormal state in which the system becomes unable to operate can be avoided without fail.

What is claimed is:

1. A nonvolatile memory control unit used with a host processor and controlling a nonvolatile memory, comprising:
   a power voltage level detection portion;
   a reset signal detection portion; and
   a data read portion,
   wherein the power voltage level detection portion receives an operation voltage supplied from outside of the nonvolatile memory control unit, and outputs a first signal to the data read portion in accordance with detection that the operation voltage exceeds a predetermined voltage level,
   wherein the reset signal detection portion receives a first control signal supplied from outside of the nonvolatile memory control unit, and outputs a second signal to the data read portion in accordance with detection that the first control signal is enabled, and
   wherein in response to a read command with address information received from the host processor, the data read portion performs a read operation for reading data from an area of the nonvolatile memory corresponding to the address information, and
   wherein in response to receiving the second signal from the reset signal detection portion, the data read portion performs the read operation for reading data from a first area of the nonvolatile memory, which is used for storing a program executed by the host processor, and waits to output the data read from the first area until the host processor requests to read.

2. A nonvolatile memory control unit according to claim 1, further comprising a buffer memory used for storing data read from the first area in the nonvolatile memory in response to receiving the second signal.

3. A nonvolatile memory control unit according to claim 2, having an error check and correction function for error checking and correcting of the data read out from the nonvolatile memory.

4. A nonvolatile memory control unit according to claim 1, wherein in response to receiving the first signal from the power voltage level detection portion and not receiving the second signal from the reset signal detection portion, the data read portion does not perform the read operation for reading data from the first area, and waits for receiving the read command from the host processor.

* * * * *